(12) United States Patent
Ipposhi et al.

(10) Patent No.: US 7,402,865 B2
(45) Date of Patent: Jul. 22, 2008

(54) SEMICONDUCTOR DEVICE INCLUDING A CONTACT CONNECTED TO THE BODY AND METHOD OF MANUFACTURING THE SAME

(75) Inventors: Takashi Ipposhi, Tokyo (JP); Toshiaki Iwamatsu, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 156 days.

(21) Appl. No.: 11/210,666

(22) Filed: Aug. 25, 2005

(65) Prior Publication Data

US 2006/0043494 A1 Mar. 2, 2006

(30) Foreign Application Priority Data

Aug. 27, 2004 (JP) .............................. 2004-248181

(51) Int. Cl.
*H01L 27/01* (2006.01)
*H01L 27/12* (2006.01)
*H01L 31/0392* (2006.01)

(52) U.S. Cl. ............... 257/347; 257/155; 257/E27.112; 257/E29.147; 257/E29.148

(58) Field of Classification Search ......... 257/347–354, 257/E27.112, E29.147, E29.148
See application file for complete search history.

(56) References Cited

U.S. PATENT DOCUMENTS 5,559,368 A 9/1996 Hu et al.
5,818,085 A 10/1998 Hsu et al.
6,252,280 B1 * 6/2001 Hirano ...................... 257/347
6,337,230 B2 1/2002 Hirano
6,429,487 B1 8/2002 Kunikiyo
6,815,296 B2 * 11/2004 Dennard et al. ............. 257/347

FOREIGN PATENT DOCUMENTS

CN 1334605 A 2/2002
JP 6-204334 7/1994
JP 2001-77368 3/2001

OTHER PUBLICATIONS

S. Maeda, et al, "Impact of 0.18μm SOI CMOS Technology Using Hybrid Trench Isolation with High Resistivity Substrate on Embedded RF/Analog Applications", Symposium on VLSI Technology Digest of Technical Papers, IEEE 2000, pp. 154-155.

* cited by examiner

*Primary Examiner*—Cuong Q Nguyen
(74) *Attorney, Agent, or Firm*—Oblon, Spivak, McClelland, Maier & Neustadt, P.C.

(57) ABSTRACT

A Schottky junction is formed at the connection between an SOI layer and a contact (namely, under an element isolation insulating film) without forming a $P^+$ region with a high impurity concentration thereat. The surface of a body contact is provide with a barrier metal. A silicide is formed between the body contact and the SOI layer as a result of the reaction of the barrier metal and the SOI layer.

10 Claims, 34 Drawing Sheets

US 7,402,865 B2

SEMICONDUCTOR DEVICE INCLUDING A CONTACT CONNECTED TO THE BODY AND METHOD OF MANUFACTURING THE SAME

BACKGROUND OF THE INVENTION

1. Field of the Invention

The present invention relates to a semiconductor device and a method of manufacturing the same, and more particularly to a semiconductor device including a contact connected to the body region of a semiconductor element.

2. Description of the Background Art

Widely known semiconductor devices include a device (hereinafter referred to as "SOI device") using an SOI substrate in which a silicon substrate, an oxide layer (BOX (buried oxide) layer), and a silicon layer (SOI (silicon on insulator) layer) are formed in this order from bottom to top. The SOI device allows reduction in parasitic capacitance, reduction in power consumption and speedup of operation, and is widely used for example in communication LSIs and portable devices.

The reduction in resistance of interconnect lines and contacts is normally an essential technique for speeding up the operation of the SOI device. In order to realize such reduction in resistance, a compound layer of silicon and metal (silicide layer) is generally formed at the connection between an element formed in the SOI device and a contact which may be the upper part of a gate wiring or source/drain region. The formation of a silicide layer is disclosed for example in Japanese Patent Application Laid-Open No. 6-204334 (1994) (FIGS. 83-84), in which a metal layer containing Ti (titanium) or Co (cobalt) is deposited by sputtering and the like on the upper part of a source/drain region defined in an SOI layer and on the upper part of a gate electrode containing polysilicon. This metal layer is then subjected to thermal processing to form a silicide layer.

As a technique for stabilizing and speeding up the operation of the SOI device, a contact is formed to be electrically connected to the body region of an element formed in the SOI device (body contact) to control the potential of the body region. Such a technique is adopted for use for example in a DTMOS (dynamic threshold voltage metal oxide semiconductor) transistor in which the gate electrode of the MOS transistor is connected through a body contact to a body region, an example of which is introduced in Japanese Patent application Laid-Open No. 2001-77368.

In the SOI device having a body contact, a leakage current is likely to flow from the body contact into a body region. Accordingly, a resistance of a certain value is desirably provided between the body contact and the body region to reduce the leakage current and power consumption. However, variations of this resistance value will disadvantageously result in variations of electrical characteristics of the SOI device.

SUMMARY OF THE INVENTION

In an SOI device having a body contact, it is an object of the present invention to control a resistance between the body contact and a body region at a desirable value. It is also an object of the present invention to reduce variations of this resistance.

A semiconductor device according to a first aspect of the present invention includes a semiconductor layer provided on an insulation layer, a semiconductor element formed in the semiconductor layer, and a body contact connected to the semiconductor layer to be connected to a body region of the semiconductor element. The connection between the body contact and the semiconductor layer is made by a Schottky junction.

The Schottky junction at the connection between the body contact and the semiconductor layer increases the resistance at the connection therebetween as compared to a conventional structure. A leakage current flowing from the body contact into the body region of the semiconductor-element is reduced accordingly, thereby reducing the power consumption of the semiconductor device.

According to a second aspect of the present invention, the semiconductor device includes a semiconductor layer provided on an insulation layer, a semiconductor element formed in the semiconductor layer, and a body contact connected to the semiconductor layer to be connected to a body region of the semiconductor element. A silicide is formed at the connection between the body contact and the semiconductor layer. The silicide reaches the depth of the insulation layer.

The silicide formed at the connection between the body contact and the semiconductor layer reaches the depth of the insulation layer, thereby providing uniformity in the depth of the silicide. Thus variations of the contact area between the silicide and the semiconductor layer are reduced, thereby reducing variations of the resistance at the connection between the body contact and the semiconductor layer. As a result, variations of electrical characteristic of the semiconductor element are reduced.

According to a third aspect of the present invention, the semiconductor device includes a semiconductor layer provided on an insulation layer, a semiconductor element formed in the semiconductor layer, and a body contact connected to the semiconductor layer to be connected to a body region of the semiconductor element. The body contact contains polysilicon.

The body contact containing polysilicon increases the resistance at the connection between the body contact and the semiconductor layer as compared to a conventional structure. A leakage current flowing from the body contact into the body region of the semiconductor element is reduced accordingly, thereby reducing the power consumption of the semiconductor device.

A fourth aspect of the present invention is intended for a method of manufacturing a semiconductor device including the following steps (a) through (d). In the step (a), a predetermined semiconductor element is formed in a semiconductor layer provided on an insulation layer. In the step (b), an interlayer insulation film is formed to cover the semiconductor element. In the step (c), a contact hole is defined in the interlayer insulation film. The contact hole is for forming a body contact connected to a body region of the semiconductor element. In the step (d), a silicide is formed in the semiconductor layer exposed at the contact hole to reach the depth of the insulation layer.

The silicide formed in the semiconductor layer exposed at the contact hole reaches the depth of the insulation layer, thereby providing uniformity in the depth of the silicide. Thus variations of the contact area between the silicide and the semiconductor layer are reduced, thereby reducing variations of the resistance at the connection between the body contact and the semiconductor layer. As a result, variations of electrical characteristic of the semiconductor element are reduced.

According to a fifth aspect of the present invention, the method of manufacturing a semiconductor device includes the following steps (a) through (f). In the step (a), an isolation insulating film is formed in an upper part of a semiconductor layer provided on an insulation layer to define an element forming region. In the step (b), a predetermined semiconductor element is formed in the element forming region defined in the semiconductor layer. In the step (c), an opening is defined in the isolation insulating film to reach the depth of the semiconductor layer under the isolation insulating film. In the step (d), a silicide is formed in the semiconductor layer exposed at the opening to reach the depth of the insulation layer. In the step (e), an interlayer insulation film is formed to cover the semiconductor element. In the step (f), a contact is formed in the interlayer insulation film to be connected to the silicide.

An opening is defined in the isolation insulating film to reach the depth of the semiconductor layer under the isolation insulating film, and a silicide is formed in the semiconductor layer exposed at the opening to reach the depth of the insulation layer. This provides uniformity in the depth of the silicide, thereby reducing variations of the contact area between the silicide and the semiconductor layer. As a result, variations of the resistance at the connection between the body contact and the semiconductor layer are reduced, and eventually, variations of the electrical characteristic of the semiconductor element are reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
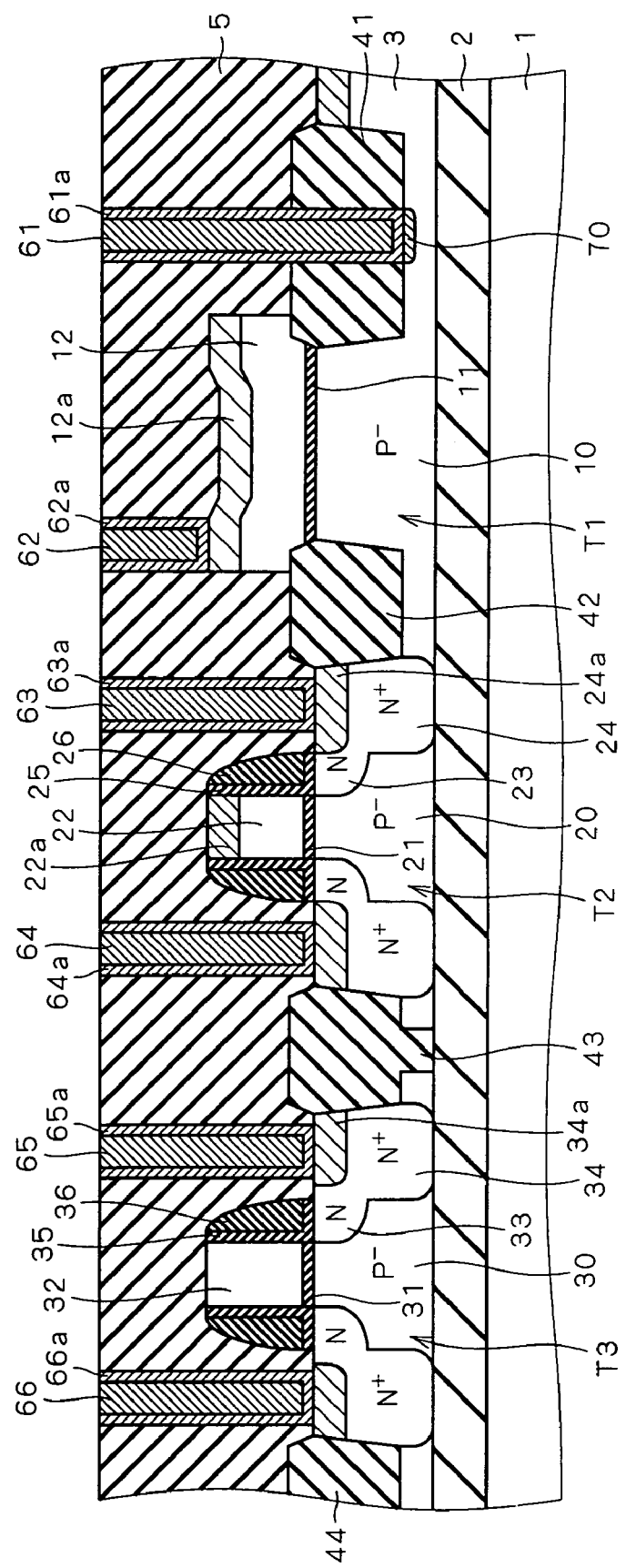
FIG. 1 shows the structure of a semiconductor device according to a first preferred embodiment of the present invention.

FIG. 1 shows the structure of a semiconductor device according to a first preferred embodiment of the present invention. The semiconductor device shown in FIG. 1 is an SOI device formed in an SOI substrate in which a silicon substrate 1, a buried oxide layer 2 (hereinafter referred to as "BOX layer 2") and a P$^-$-type silicon layer 3 (hereinafter referred to as "SOI layer 3") are formed in this order from bottom to top.

Element isolation insulating films 41, 42, 43 and 44 are formed in the upper part of the SOI layer 3 to define active regions (element forming regions) in which MOS transistors T1, T2 and T3 as semiconductor elements are formed. More specifically, the MOS transistor T1 is formed between the element isolation insulating films 41 and 42, the MOS transistor T2 is formed between the element isolation insulating films 42 and 43, and the MOS transistor T3 is formed between the element isolation insulating films 43 and 44. The element isolation insulating films 41, 42 and 44 do not reach the depth of the BOX layer 2, thereby providing so-called "partial isolation". The element isolation insulating film 43 reaches the depth of the BOX layer 2, thereby providing so-called "full isolation".

With reference to FIG. 1, the MOS transistor T1 includes a gate insulation film 11, and a gate electrode 12 provided with a silicide 12a in its upper-part. The MOS transistor T2 includes a gate insulation film 21, a gate electrode 22, source/drain regions 24, and LDD (lightly doped drain) regions 23 connected to the source/drain regions 24. Silicides 22a and 24a are formed in the respective upper parts of the gate electrode 22 and the source/drain regions 24. A CVD (chemical vapor deposition) oxide film 25 and a sidewall 26 are formed on the side surface of the gate electrode 22. In FIG. 1, the MOS transistor T1 is shown in cross section across the gate, and hence the source/drain regions and LDD regions of the MOS transistor T1 are omitted from FIG. 1. However, the MOS transistor T1 has the same structure as that of the MOS transistor T2.

The MOS transistor T3 includes a gate insulation film 31, a gate electrode 32, LDD regions 33, and source/drain regions 34. Silicides 34a are formed in the upper parts of the source/drain regions 34. A CVD oxide film 35 and a sidewall 36 are formed on the side surface of the gate electrode 32. The MOS transistor T3 has substantially the same structure as that of the MOS transistor T2, except that the upper part of the gate electrode 32 is not silicided as shown in FIG. 1.

Reference numerals 10, 20 and 30 in FIG. 1 respectively represent P⁻ regions, namely body regions of the MOS transistors T1, T2 and T3.

An interlayer insulation film 5 is provided to cover the MOS transistors T1, T2 and T3. Contacts 61 through 66 are formed in the interlayer insulation film 5. The respective surfaces of the contacts 61 through 66 are provided with barrier metals 61a through 66a.

The body contact 61 is a so-called "body contact" electrically connected to the respective body regions 10 and 20 of the MOS transistors T1 and T2. The body contact 61 penetrates the element isolation insulating film 41 providing partial isolation to reach the SOI layer 3 thereunder. The barrier metal 61a reacts with the SOI layer 3 to form a silicide 70 at the connection between the body contact 61 and the SOI layer 3.

With reference to FIG. 1, the P-type SOI layer 3 under the element isolation insulating film 41 connects to the body region 10 of the MOS transistor T1 (which is also of P-type). Thus the SOI layer 3 under the element isolation insulating film 41 and the body region 10 are electrically connected. The element isolation insulating film 42 provides partial isolation, thereby electrically connecting the body region 10 of the MOS transistor T1 and the body region 20 of the MOS transistor T2 through a P⁻ region (not shown in FIG. 1). The body contact 61 connecting to the SOI layer 3 under the element isolation insulating film 41 is then electrically connected to both the body region 10 of the MOS transistor T1 and the body region 20 of the MOS transistor T2.

In a conventional semiconductor device, a P⁺ region having a high impurity concentration of $10^{20}$ to $10^{21}$ cm$^{-3}$ is formed at the connection between a P-type SOI layer and a body contact, thereby providing ohmic contact between the body contact and the SOI layer. As an example, in the case of a body contact with a diameter of 0.12 μm, the resistance of each body contact at the connection with the SOI layer is about several tens of Ω.

In contrast, in the first preferred embodiment, a Schottky junction is formed at the connection between the SOI layer 3 and the body contact 61 (namely, under the element isolation insulating film 41) without forming a P⁺ region thereat. More specifically, the impurity concentration of the SOI layer 3 is controlled to be about $10^{18}$ to $10^{20}$ cm$^{-3}$ to form a Schottky junction between the SOI layer 3 and the body contact 61. When the body contact 61 has a diameter of 0.12 μm, for example, the resistance of the body contact 61 at the connection with the SOI layer 3 is as high as hundreds of k ohms to several M ohms.

The Schottky junction between the body contact 61 and the SOI layer 3 increases the resistance at the connection therebetween. A leakage current flowing from the body contact 61 into the body regions 10 and 20 is reduced accordingly, thereby reducing the power consumption of the semiconductor device. The impurity concentration of the SOI layer 3 is suitably controlled in the range of about $10^{18}$ to $10^{20}$ cm$^{-3}$, whereby the resistance at the connection between the body contact 61 and the SOI layer 3 is controlled at a desirable value.

As discussed with reference to FIG. 1, the barrier metal 61a is formed on the surface of the body contact 61 and the silicide 70 is formed between the body contact 61 and the SOI layer 3 as a result of the reaction of the barrier metal 61a and the SOI layer 3. That is, the foregoing Schottky junction is formed, in a strict sense, between the silicide 70 on the surface of the body contact 61 and the SOI layer 3. The body contact 61 and the SOI layer 3 are connected through the silicide 70, thereby providing stabilized connection therebetween. As a result, variations of the resistance at the connection can be reduced.

The body contact 61 is formed to penetrate the element isolation insulating film 41, and hence the forming region of the body contact 61 is included in the forming region of the element isolation insulating film 41. Thus a separate region is not required for forming the body contact 61, leading to reduction of an area for forming the semiconductor device.

FIGS. 2 through 8 show the process for manufacturing the semiconductor device shown in FIG. 1. Next, a method of manufacturing the semiconductor device according to the first preferred embodiment will be discussed.

First, an SOI substrate is prepared in which the silicon substrate 1, the BOX layer 2 and the SOI layer 3 are arranged in this order from bottom to top. This SOI substrate may be formed by any techniques such as SIMOX (separation by implanted oxygen), wafer bonding and the like. Generally, the SOI layer 3 has a thickness of about 50 to 200 nm, and the BOX layer 2 has a thickness of about 100 to 400 nm.

Next, a circuit including the MOS transistors T1, T2 and T3 is formed in the SOI layer 3. In the present invention, the MOS transistors T1, T2 and T3 may be formed by a commonly employed way as will be discussed below, for example.

Figure 2:
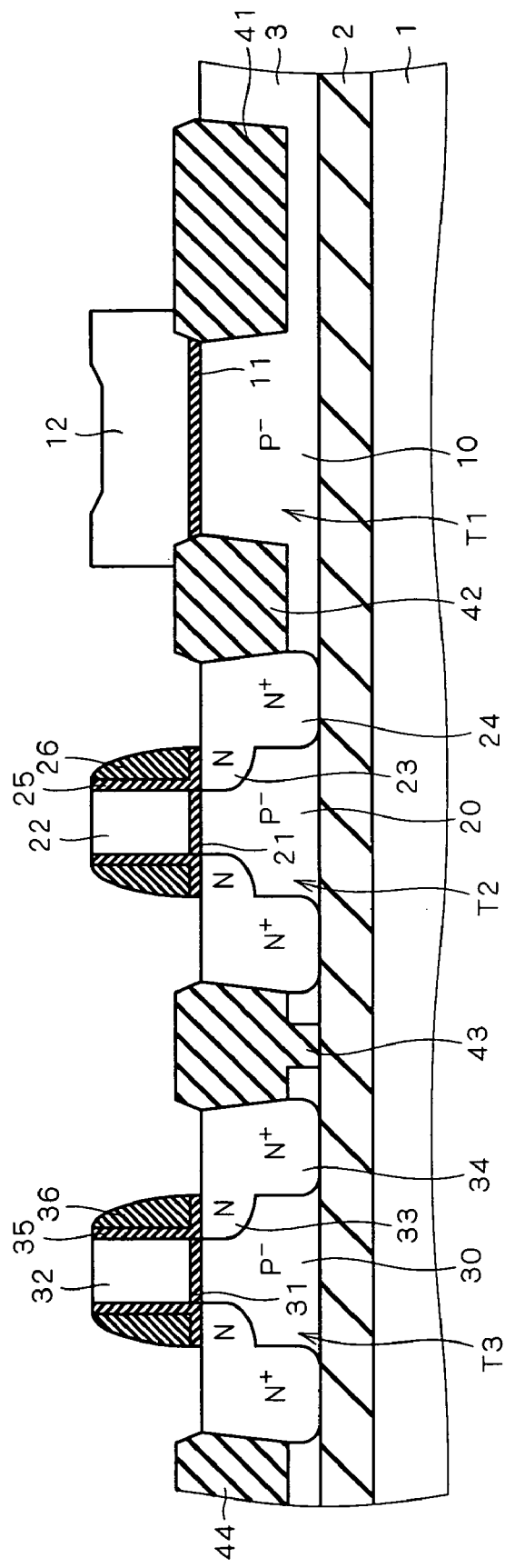
FIGS. 2 through 8 show the process for manufacturing the semiconductor device according to the first preferred embodiment.

First, the element isolation insulating films 41 through 44 are formed in an element isolation region in the SOI layer 3, followed by channel implant for determining the threshold voltage of each MOS transistor. Then a silicon oxide film is formed on the upper surface of the SOI layer 3 and polysilicon is deposited thereon. Thereafter patterning is performed to form the gate insulation films 11, 21, 31 and the gate electrodes 12, 22 and 32. Using the gate electrodes 12, 22 and 32 as a mask, ion implantation is performed to define the LDD regions 23 and 33 (LDD regions of the MOS transistor T1 are not shown). A silicon oxide film is deposited by CVD (chemical vapor deposition) on the side surfaces of the gate electrodes 12, 22, 32 and on the upper surface of the SOI layer 3. A silicon nitride film is thereafter deposited and is then etched back, thereby forming the CVD oxide films 25 and 35 and the sidewalls 26 and 36 (FIG. 2). A CVD oxide film and a sidewall on the side surface of the gate electrode 12 are not shown.

Figure 3:
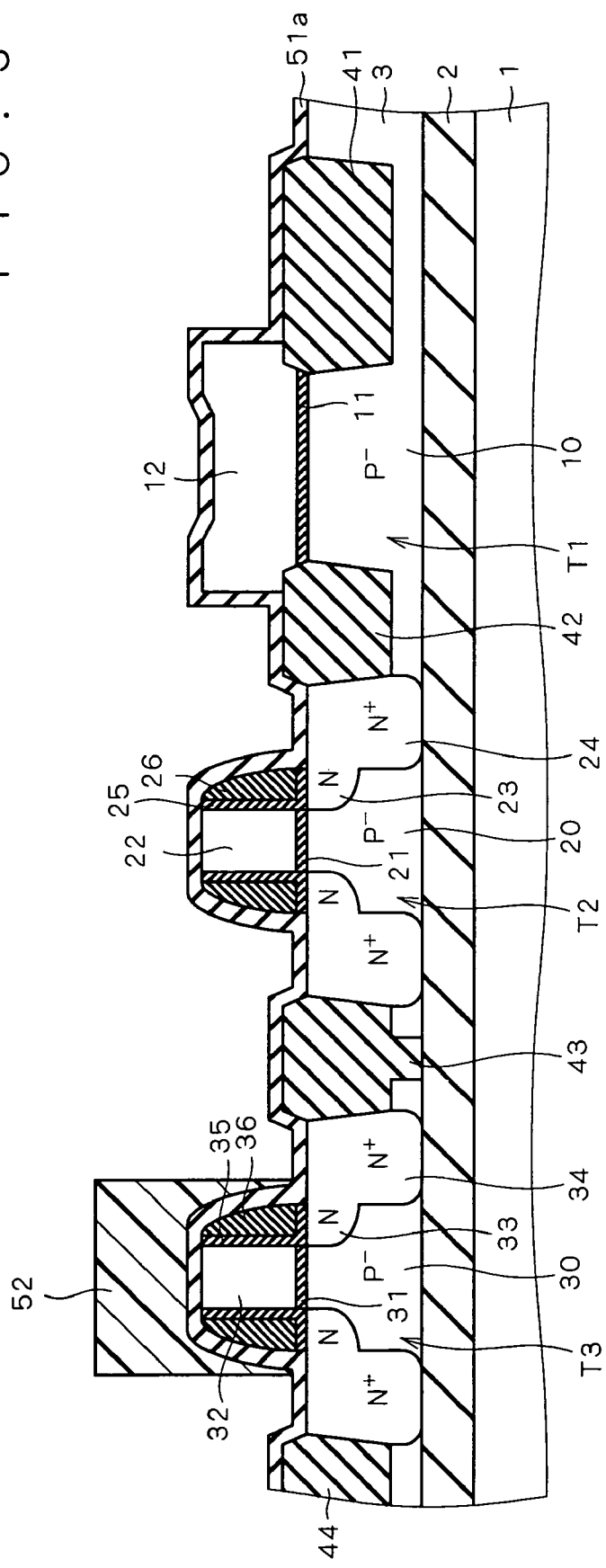
Figure 4:
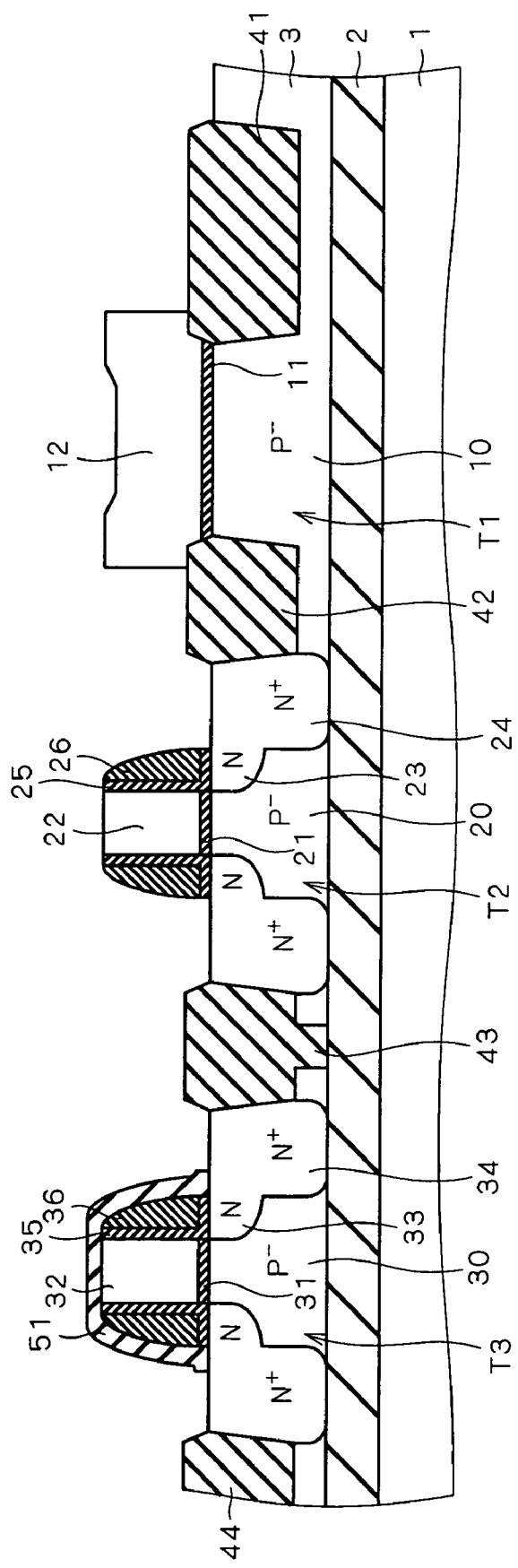

A subsequent step is silicidation of predetermined portions of the MOS transistors T1, T2 and T3. Prior to silicidation, an insulating film which is a so-called silicide protection film is formed to cover a region not intended for silicidation (here, the gate electrode 32 of the MOS transistor T3). More specifically, a silicon oxide film 51a is deposited for example by CVD on the entire surface of the SOI substrate, and a resist pattern 52 is formed over the gate electrode 32 (FIG. 3). The silicon oxide film 51a is etched using the resist pattern 52 as a mask to form a silicide protection film 51 over the gate insulation film 31 (FIG. 4).

Figure 5:
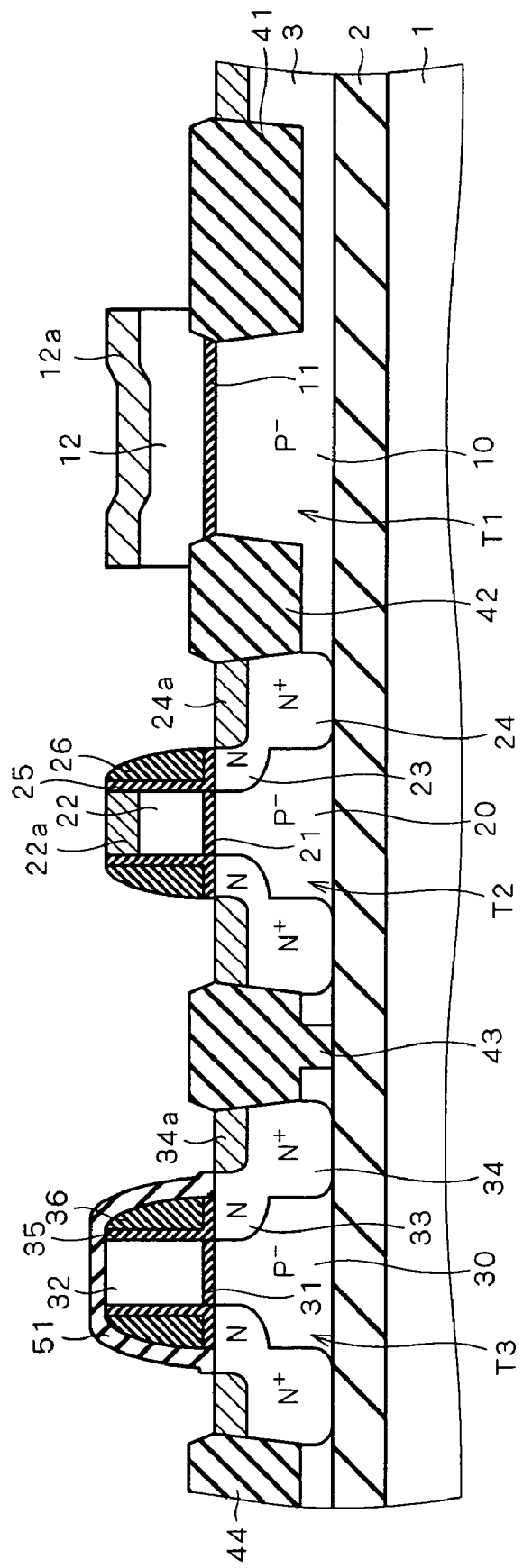

Next, certain metal for use in silicidation such as Co is deposited on the MOS transistors T1, T2 and T3 to a thickness for example of about 3 to 20 nm, followed by thermal processing at a temperature of about 300 to 800° C. for a duration of about a few seconds to a few minutes so that the deposited metal reacts with silicon. The gate electrodes 12 and 22, and the source/drain regions 24 and 34 are not covered with the silicide protection film 51 so that the metal is directly deposited thereon. Then the respective upper parts are provided with the silicides 12a, 22a, 24a and 34a. The metal is deposited by way of the silicide protection film 51 on the gate electrode 32 covered with the silicide protection film 51, and hence no silicidation occurs at the upper part of the gate electrode 32 (FIG. 5). By way of example, the silicide formed at this stage may be Ti silicide, Co silicide, Ni silicide, Pt silicide and the like.

Figure 6:
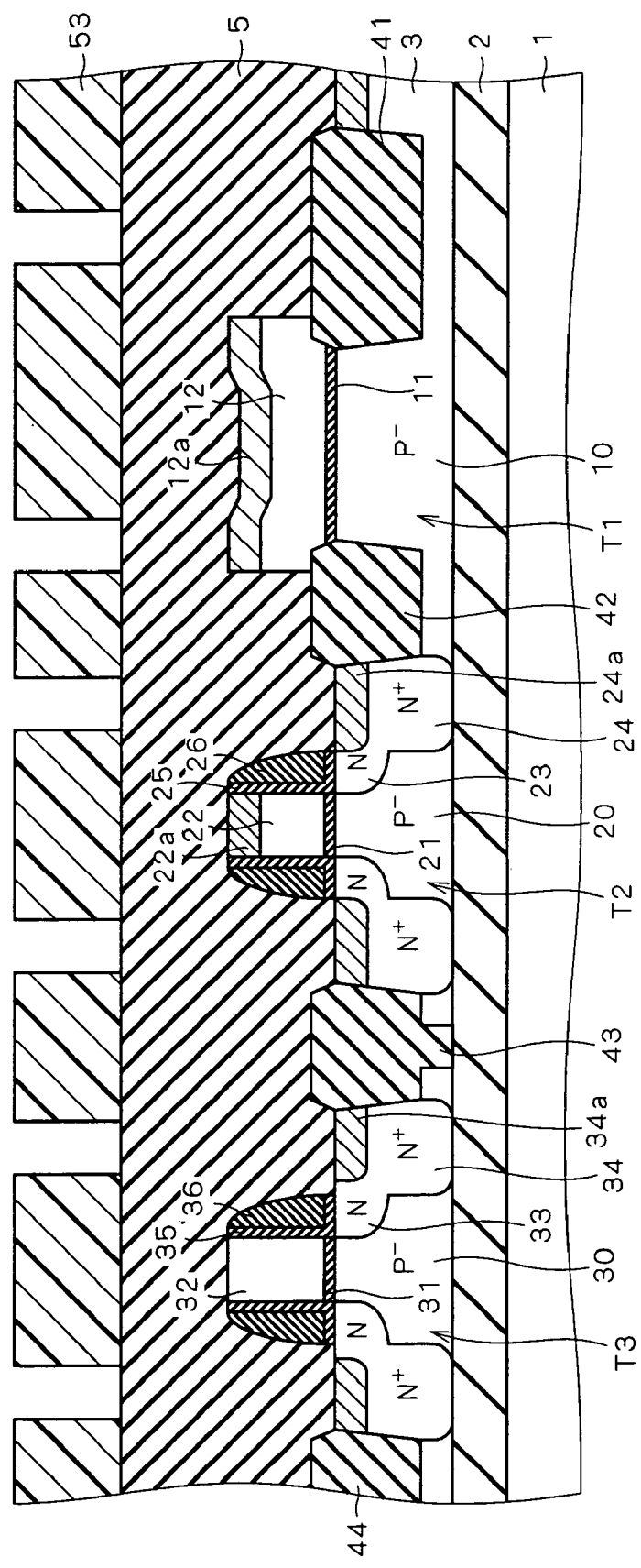
Figure 7:
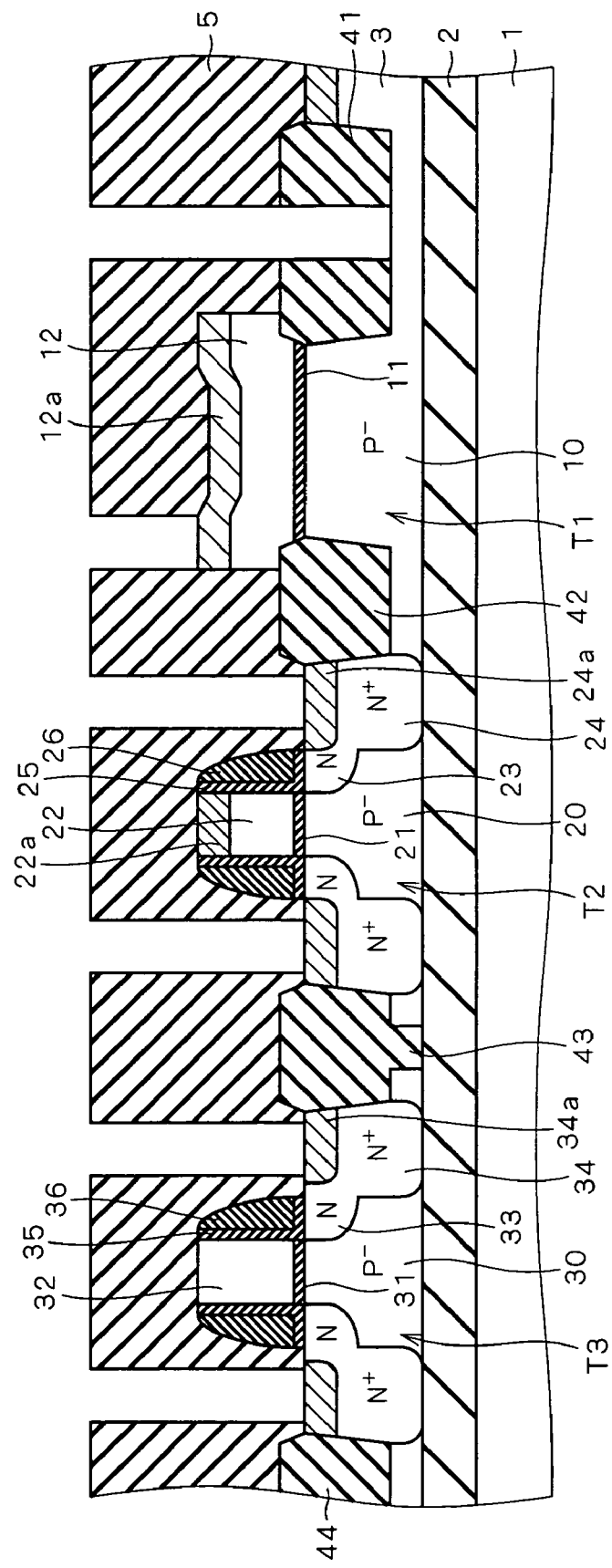

Subsequently, a silicon oxide film is deposited to cover the MOS transistors T1, T2 and T3 to form the interlayer insulation film 5, and a resist pattern 53 is formed thereon that has openings to expose regions for forming the contacts 61 through 66 (FIG. 6). The silicide protection film 51 serves as an integral part of the interlayer insulation film 5, and hence are not shown in FIGS. 6, 7 and 8. Next, the interlayer insulation film 5 is etched using the resist pattern 53 as a mask to define contact holes in the interlayer insulation film 5. The element isolation insulating film 41 is thereafter etched such that the contact hole for forming the body contact 61 reaches as deep as the SOI layer 3 (FIG. 7).

Figure 8:
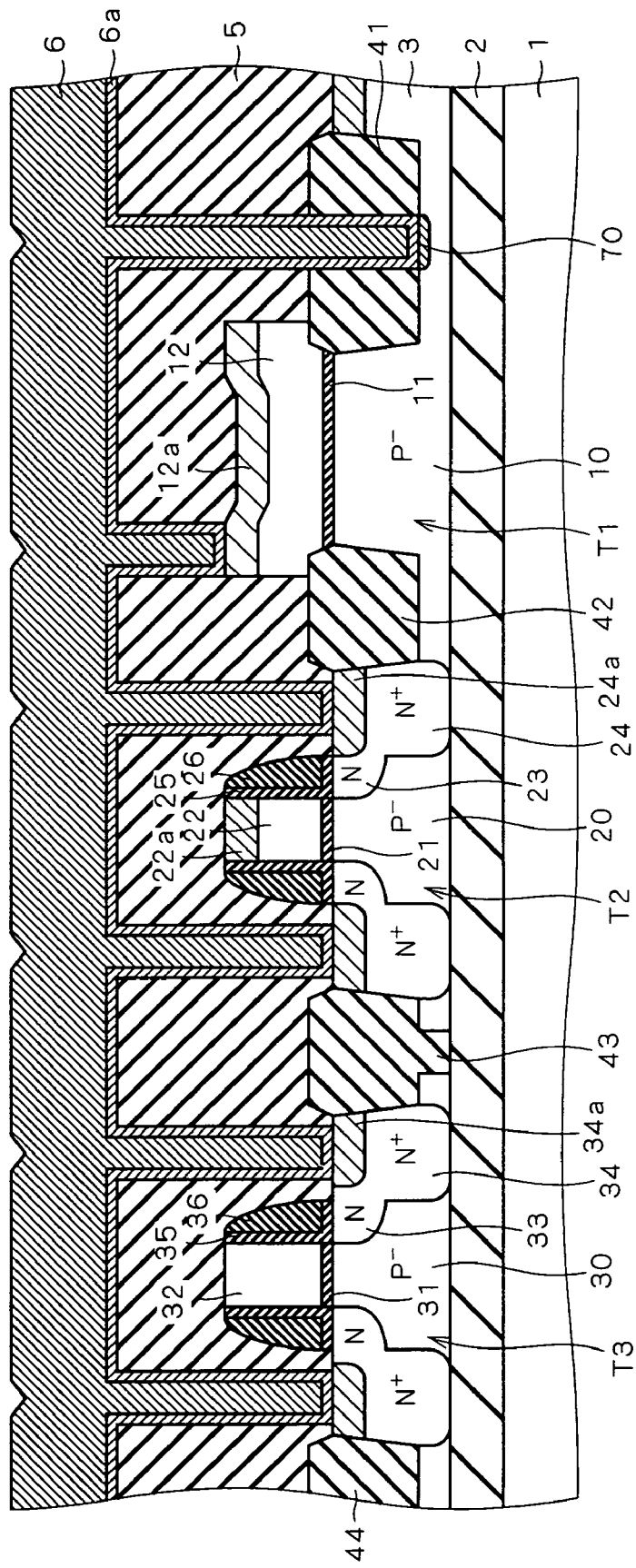

A barrier metal material 6a such as Ti or Ti/TiN and a metal contact material 6 such as tungsten are deposited to fill each contact hole (FIG. 8). At the bottom of the contact hole for the body contact 61, the barrier metal material 6a reacts with the SOI layer 3 under the element isolation insulating film 41 to form the silicide 70. When the barrier metal material 6a is Ti or Ti/TiN, the resultant silicide 70 is $TiSi_2$.

The excess metal contact material 6 and barrier metal material 6a on the upper surface of the interlayer insulation film 5 are removed to form the contacts 61 through 66, whereby the semiconductor device shown in FIG. 1 is obtained.

Second Preferred Embodiment

Figure 9:
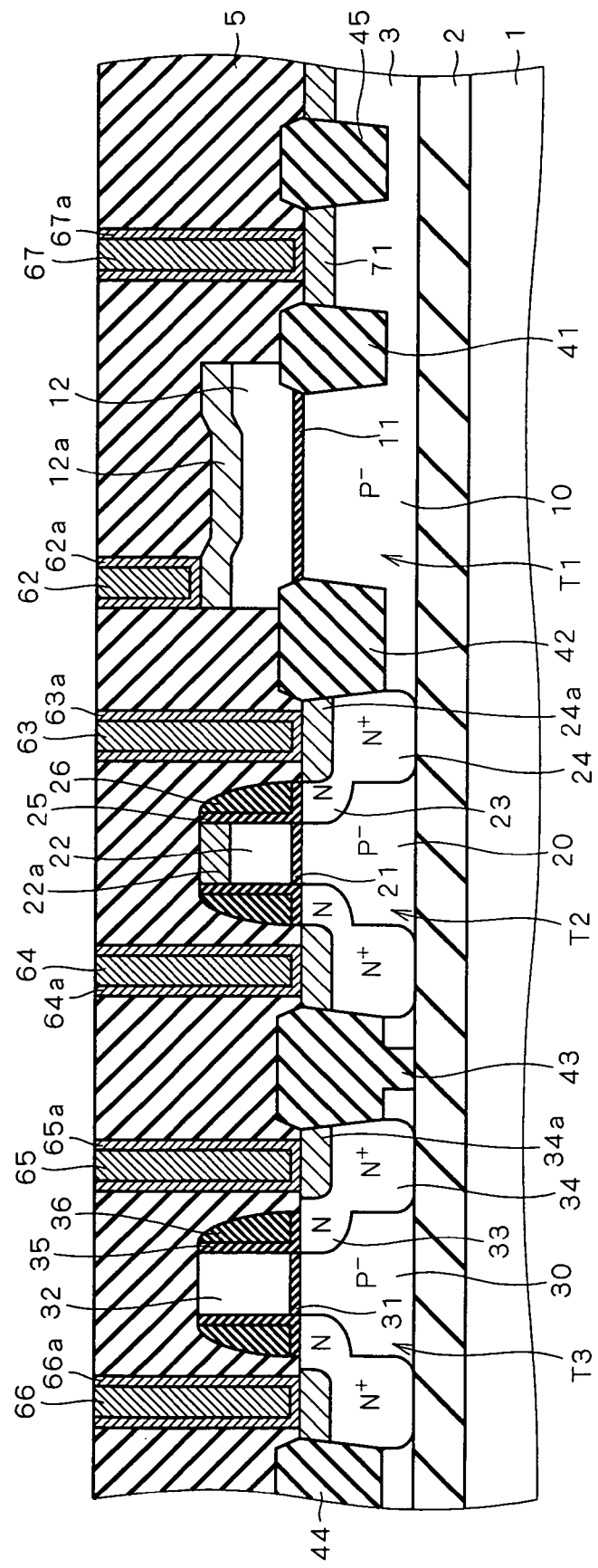
FIG. 9 shows the structure of a semiconductor device according to a second preferred embodiment of the present invention.

FIG. 9 shows the structure of a semiconductor device according to a second preferred embodiment of the present invention. In FIG. 9, the elements similar to those shown in FIG. 1 are designated by the same reference numerals, and will not be discussed.

In the first preferred embodiment described above, the body contact 61 penetrates the element isolation insulating film 41 to reach the SOI layer 3 thereunder. In contrast, in the second preferred embodiment, a body contact 67 is formed to be connected to the upper surface of the SOI layer 3 defined between the element isolation insulating films 41 and 45 as shown in FIG. 9. That is, in the first preferred embodiment, the body contact 61 is connected to a thin portion of the SOI layer 3 reduced in thickness as a result of the formation of the interlayer insulation film 41. In contrast, in the second preferred embodiment, the body contact 67 is connected to a thick portion of the SOI layer 3. A barrier metal 67a is formed on the surface of the body contact 67. A silicide 71 is formed at the connection between the body contact 67 and the SOI layer 3 in the same process as that for forming the silicides 24a and 34a in the upper parts the source/drain regions 24 and 34.

The element isolation insulating film 41 provides partial isolation, whereby the thick portion of the SOI layer 3 is electrically connected through the thin portion of the SOI layer 3 under the element isolation insulating film 41 to the body region 10 of the MOS transistor T1. Like in the first preferred embodiment, the body region 10 of the MOS transistor T1 is electrically connected to the body region 20 of the MOS transistor T2. That is, like the body contact 61, the body contact 67 is also electrically connected to both the body regions 10 and 20.

In the second preferred embodiment, a Schottky junction is also formed between the SOI layer 3 and the body contact 67 without forming a $P^+$ region at the connection between the SOI layer 3 and the body contact 67. Thus when the body contact 67 has a diameter of 0.12 μm, for example, the resistance of the body contact 67 at the connection with the SOI layer 3 is as high as hundreds of k ohms to several M ohms.

Like in the first preferred embodiment, a leakage current flowing from the body contact 67 into the body regions 10 and 20 is reduced accordingly, thereby reducing the power consumption of the semiconductor device. The impurity concentration of the SOI layer 3 is suitably controlled, whereby the resistance at the connection between the body contact 67 and the SOI layer 3 is controlled at a desirable value.

The silicide 71 is formed at the connection between the body contact 67 and the SOI layer 3. That is, the foregoing Schottky junction is formed, in a strict sense, between the silicide 71 and the SOI layer 3. The body contact 67 and the SOI layer 3 are connected through the silicide 71, thereby providing stabilized connection therebetween. As a result, variations of the resistance at the connection can be reduced.

In the second preferred embodiment, the body contact 67 is connected to the thick portion of the SOI layer 3 without penetrating an element isolation insulating film. Thus a contact hole for the body contact 67 is not required to reach a specifically great depth. That is, the contact hole for the body contact 67 can be at the same depth as that of the other contacts 63 through 66, whereby the manufacturing process can be simplified as compared to the first preferred embodiment.

Figure 10:
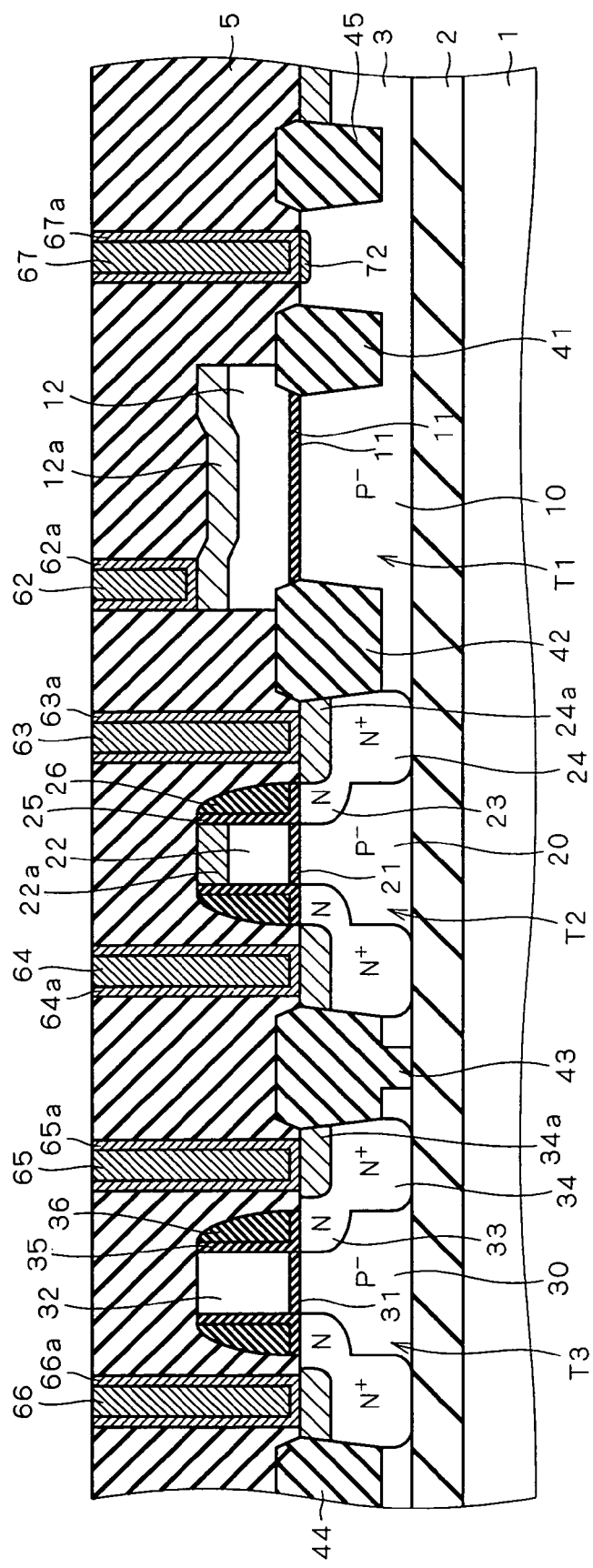
FIGS. 10 and 11 show a modification of the second preferred embodiment.

FIG. 10 shows a modification of the second preferred embodiment. In the structure of FIG. 9, the silicide 71 is formed at the connection between the SOI layer 3 and the body contact 67 in the same process as that for forming the silicides 24a and 34a. Alternatively, the silicide 71 may not be formed as shown in FIG. 10. Instead, a silicide 72 is formed at the connection between the body contact 67 and the SOI layer 3 as a result of the reaction of the barrier metal 67a on the surface of the body contact 67 and the SOI layer 3. This structure clearly provides the same effects as those discussed above.

Figure 11:
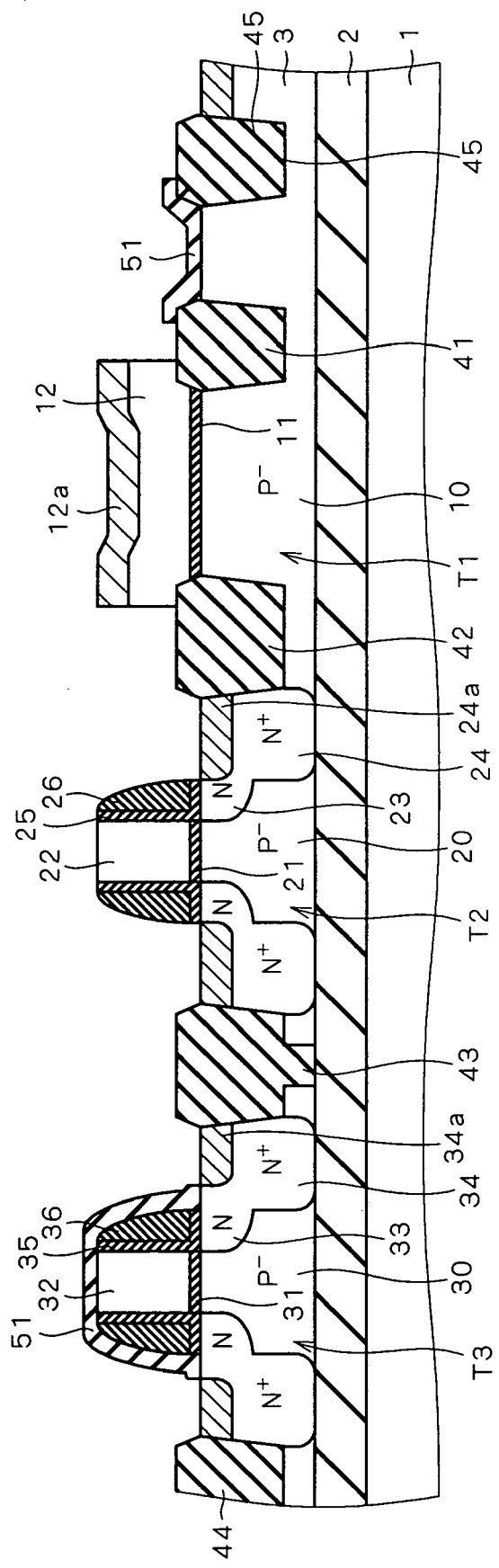

In order to avoid the formation of the silicide 71 at the connection between the SOI layer 3 and the body contact 67, a silicide protection film may be provided in the manufacturing process on this connection. More specifically, in the step discussed in the first preferred embodiment with reference to FIGS. 3 and 4 for forming the silicide protection film 51 on the gate electrode 32, the silicide protection film 51 may be shaped to further cover the SOI layer 3 defined between the element isolation insulating films 41 and 45. Then the upper part of the SOI layer 3 remains unsilicided between the element isolation insulating films 41 and 45 while the silicides 12a, 24a and 34a are formed (FIG. 11).

Third Preferred Embodiment

Figure 12:
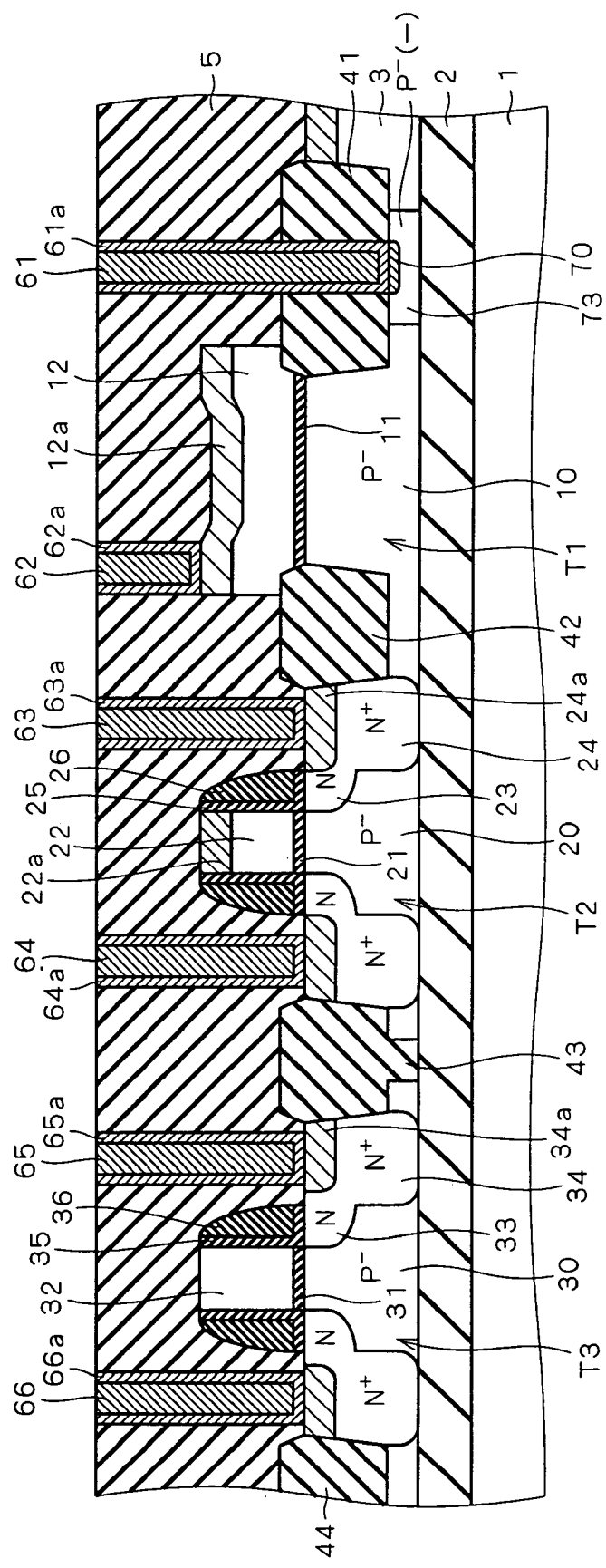
FIG. 12 shows the structure of a semiconductor device according to a third preferred embodiment of the present invention.

FIG. 12 shows the structure of a semiconductor device according to a third preferred embodiment of the present invention. In FIG. 12, the elements similar to those shown in FIG. 1 are designated by the same reference numerals, and will not be discussed.

In the third preferred embodiment, a region with an impurity concentration locally lower than that of the surrounding region is provided in the vicinity of the connection between the SOI layer 3 and the body contact 61 (namely, in the vicinity of the silicide 70). In FIG. 12, this is shown as a region 73 lower in impurity concentration and high in resistance than the surrounding P⁻ region. In the following, a P⁻ region lower in impurity concentration than the surrounding P⁻ region referred to as a "P⁻ (−) region".

A Schottky junction is formed between the SOI layer 3 and the body contact 61 without forming a P⁺ region at the connection between the SOI layer 3 and the body contact 61. Further, the P⁻ (−) region 73 is provided in the vicinity of the connection between the SOI layer 3 and the body contact 61, thereby increasing the resistance at the connection between the SOI layer 3 and the body contact 61 to a higher level. Thus a leakage current flowing from the body contact 61 into the body regions 10 and 20 is reduced to a lower level, thereby reducing the power consumption of the semiconductor device. The impurity concentration of the P⁻ (−) region 73 is suitably controlled, whereby the resistance at the connection between the body contact 61 and the SOI layer 3 is controlled at a desirable level. This realizes a higher degree of flexibility than the control of the impurity concentration of the SOI layer 3 in its entirety.

Figure 13:
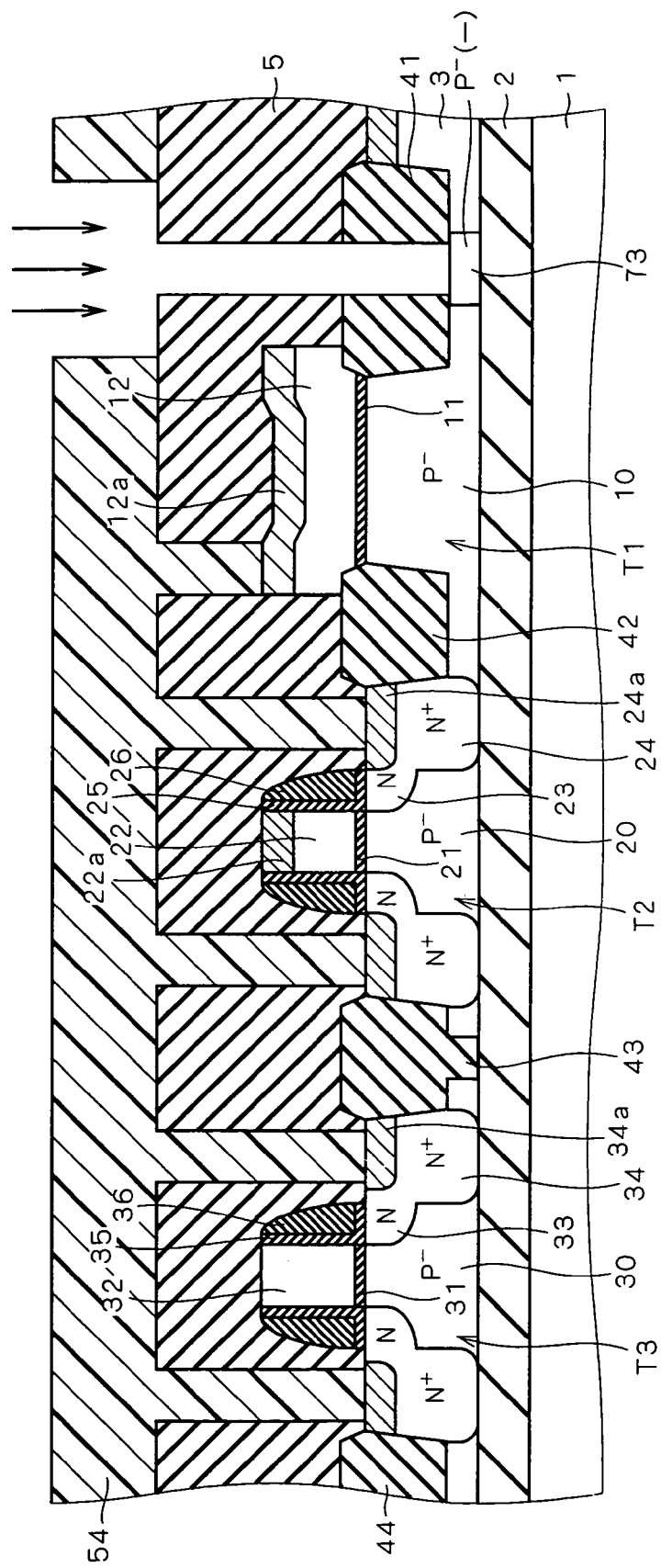
FIG. 13 shows the process for manufacturing the semiconductor device according to the third preferred embodiment.

The P⁻ (−) region 73 may be formed after the formation of contact holes (discussed in the first preferred embodiment with reference to FIG. 7). More specifically, after contact holes for the contacts 61 through 66 are defined, a resist pattern 54 is formed that has an opening to expose only the contact hole for the body contact 61 as shown in FIG. 13. Using the resist pattern 54 as a mask, N-type impurities (such as P ions or As ions) of the opposite conductivity type to the SOI layer 3 are implanted (which is so-called "counter-doping") to form the P⁻ (−) region 73 in the contact hole for the body contact 61. As this time, an implant dose is controlled at about $10^{13}$ cm$^{-2}$ to $10^{15}$ cm$^{-2}$, for example.

Fourth Preferred Embodiment

In the first preferred embodiment, for example, the resistance at the connection between the body contact 61 and the SOI layer 3 depends on the contact area between the silicide 70 and the SOI layer 3. The silicide 70 is formed by the reaction of the barrier metal 61a and the SOI layer 3, which means the depth of the silicide 70 is hard to control. Nonuniformity in the depth of the silicide 70 causes variations of the contact area between the silicide 70 and the SOI layer 3, resulting in variations of the resistance at the connection between the body contact 61 and the SOI layer 3.

Figure 14:
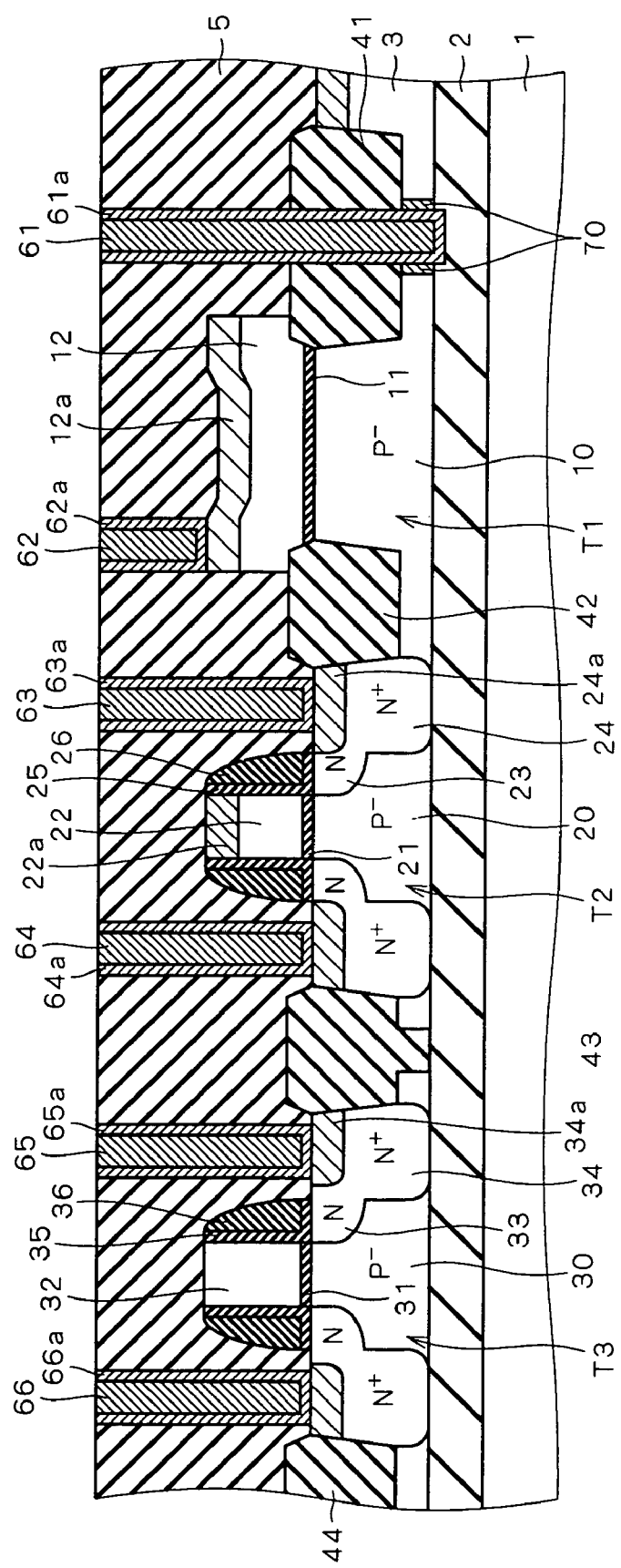
FIG. 14 shows the structure of a semiconductor device according to a fourth preferred embodiment of the present invention.

FIG. 14 shows the structure of a semiconductor device according to a fourth preferred embodiment of the present invention. In FIG. 14, the elements similar to those shown in FIG. 1 are designated by the same reference numerals, and will not be discussed.

With reference to FIG. 14, the semiconductor device of the fourth preferred embodiment differs from the device of the first preferred embodiment in that the body contact 61 is formed to penetrate the SOI layer 3 to reach as deep as the BOX layer 2. The semiconductor device of the fourth preferred embodiment has otherwise the same structure as that of the first preferred embodiment.

When the body contact 61 is formed to reach as deep as the BOX layer 2, the silicide 70 formed on the side surface of the body contact 61 also reaches the depth of the BOX layer 2, providing uniformity in the depth of the silicide 70. Thus variations of the contact area between the silicide 70 and the SOI layer 3 are reduced, thereby reducing variations of the resistance at the connection between the body contact 61 and the SOI layer 3, and eventually reducing variations of electrical characteristics of the semiconductor element. In the fourth preferred embodiment, the contact area between the silicide 70 and the SOI layer 3 depends on the thickness of the SOI layer 3 under the element isolation insulating film 41, namely, the depth of the element isolation insulating film 41. The depth of the element isolation insulating film 41 is easier to control than the depth of the silicide 70 and can be controlled precisely. Thus the dependency of the contact area between the silicide 70 and the SOI layer 3 on the depth of the element isolation insulating film 41 does not cause serious problems.

In order for the body contact 61 to reach the BOX layer 2, in the step of forming contact holes discussed in the first preferred embodiment with reference to FIG. 7, a contact hole for the body contact 61 is shaped to penetrate the SOI layer 3 to reach as deep as the BOX layer 2.

Figure 15:
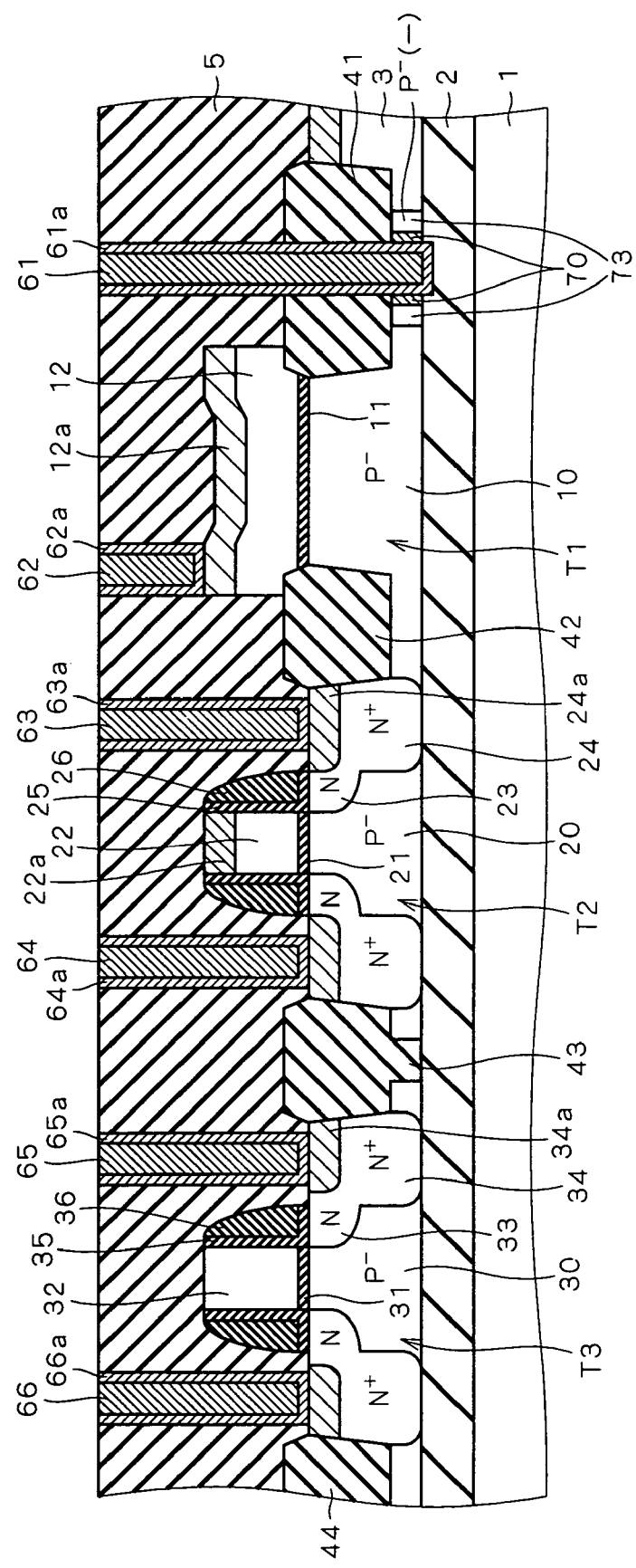
FIGS. 15 and 16 each show a modification of the fourth preferred embodiment.

FIG. 15 shows a modification of the fourth preferred embodiment. The example of FIG. 15 is a combination of the third preferred embodiment with the fourth preferred embodiment, in which the P⁻ (−) region 73 with an impurity concentration locally lower than that of the surrounding region is provided in the vicinity of the connection between the SOI layer 3 and the body contact 61 (namely, in the vicinity of the silicide 70). This further increases the resistance at the connection between the SOI layer 3 and the body contact 61, thereby reducing a leakage current flowing from the body contact 61 into the body regions 10 and 20. The impurity concentration of the P⁻ (−) region 73 is suitably controlled, whereby the resistance at the connection between the body contact 61 and the SOI layer 3 is controlled at a desirable level.

In order to form the P⁻ (−) region 73, after the formation of contact holes, the resist pattern 54 may be formed that has an opening to expose only the contact hole for the body contact 61 as shown in FIG. 13. Using the resist pattern 54 as a mask, N-type impurities are implanted at a dose of about $10^{13}$ cm$^{-2}$ to $10^{15}$ cm$^{-2}$, for example. In the fourth preferred embodiment, the contact hole for the body contact 61 reaches as deep as the BOX layer 2, whereby the SOI layer 3 is exposed at the side surface (and not at the bottom) of the contact hole for the body contact 61. Thus the N-type impurities for forming the P⁻ (−) region 73 are desirably implanted at a tilt angle so that the impurities are effectively implanted into the SOI layer 3 at the side surface of the contact hole.

Figure 16:
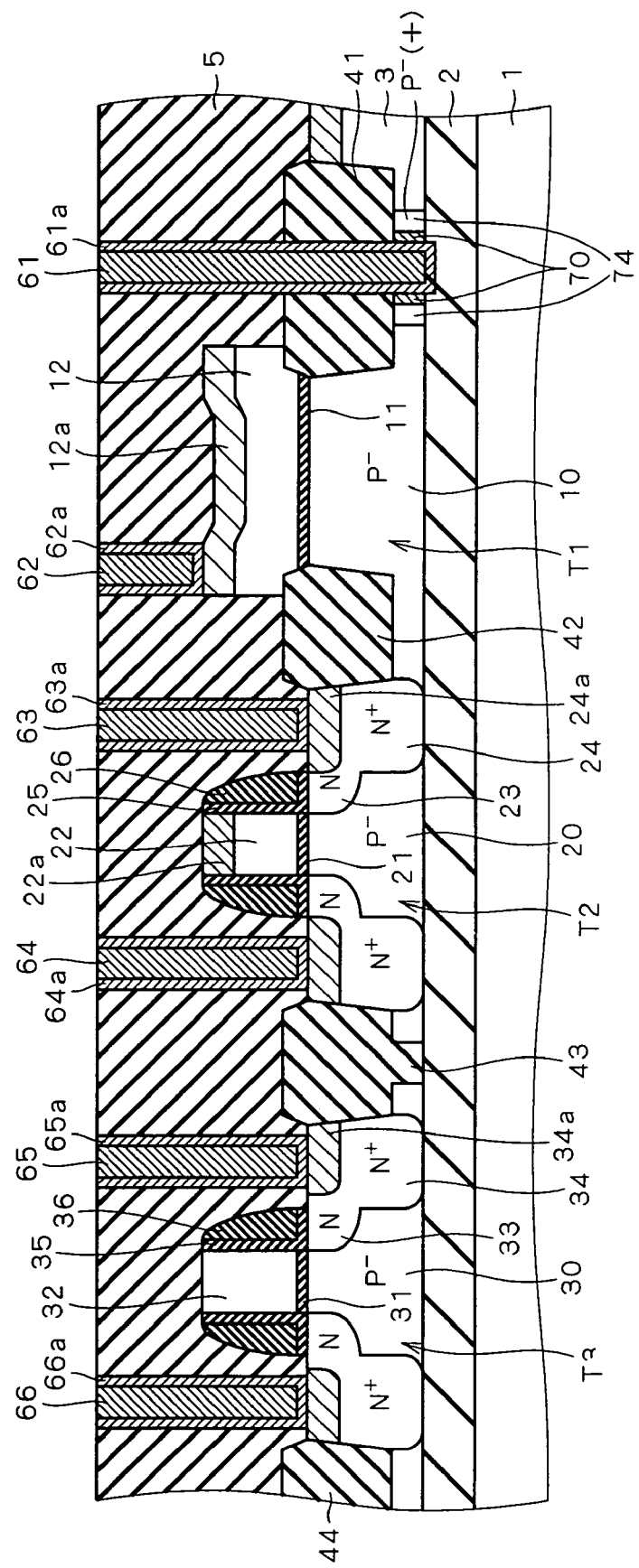

FIG. 16 shows another modification of the fourth preferred embodiment. The structure of FIG. 16 differs from that of FIG. 15 in that the P⁻ (−) region 73 is replaced by a P⁻ region 74 having an impurity concentration locally higher than that of the surrounding region (which will be referred to as a "P⁻ (+) region 74").

In the fourth preferred embodiment, the bottom surface of the body contact 61 connects to the BOX layer 2, meaning that the silicide 70 and the SOI layer 3 are in contact with each other only at the side surface of the body contact 61. Further, the body contact 61 connects to the thin portion of the SOI layer 3 under the element isolation insulating film 41. Thus the contact area between the silicide 70 and the SOI layer 3 is limited. Accordingly, if the thickness of the SOI layer 3 is considerably small under the element isolation insulating film 41, the resistance at the connection between the body contact 61 and the SOI layer 3 increases to an unnecessarily high level. In this case, the potential of the body regions 10 and 20 is hard to control. In response, the P⁻ (+) region 74 is provided in the vicinity of the connection between the body contact 61 and the SOI layer 3 as shown in FIG. 16. This reduces the resistance at the connection between the body contact 61 and the SOI layer 3, thereby to overcome the foregoing difficulty in controlling the potential of the body regions 10 and 20.

The P⁻ (+) region 74 can be formed by the same process as used for forming the P⁻ (−) region 73 discussed above with reference to FIG. 15, except that P-type impurities such as B ions or BF2 ions should be implanted at a dose of about $10^{13}$ cm$^{-2}$ to $10^{15}$ cm$^{-2}$, for example.

Fifth Preferred Embodiment

Figure 17:
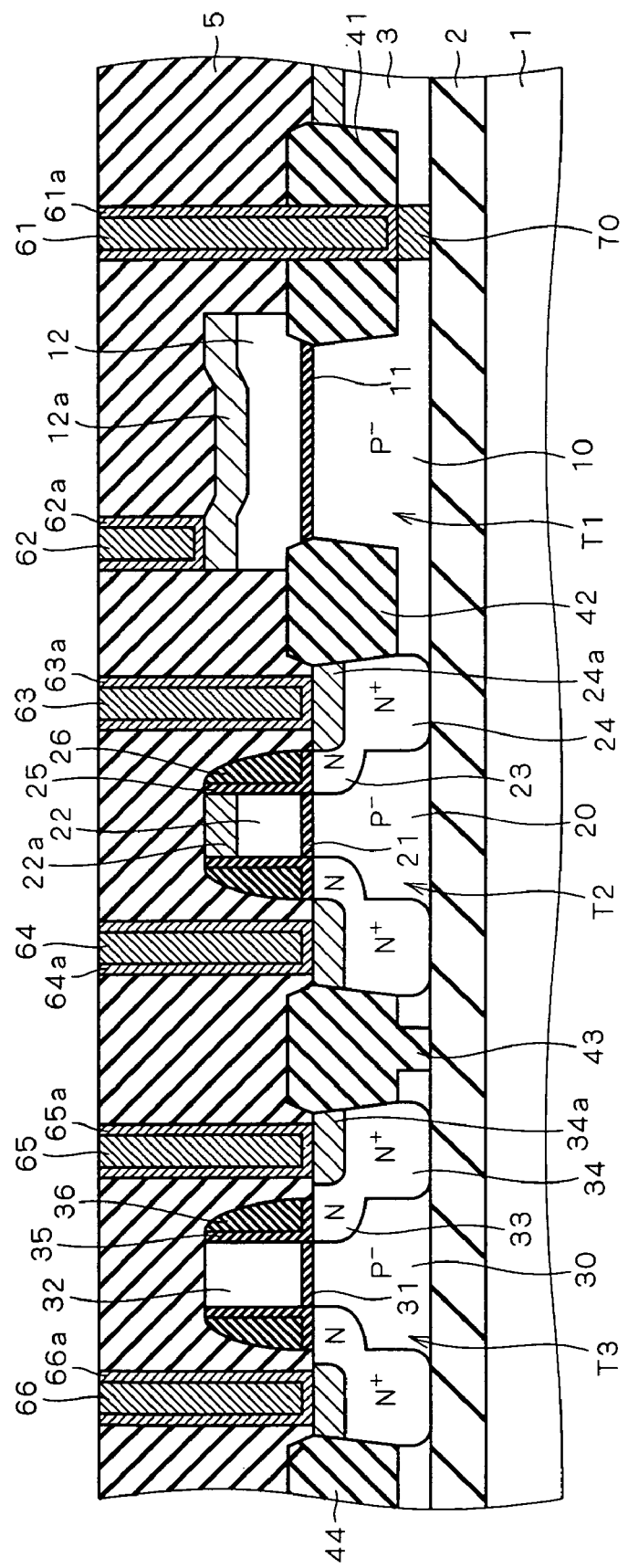
FIG. 17 shows the structure of a semiconductor device according to a fifth preferred embodiment of the present invention.

FIG. 17 shows the structure of a semiconductor device according to a fifth preferred embodiment of the present invention. In FIG. 17, the elements similar to those shown in FIG. 1 are designated by the same reference numerals, and will not be discussed.

With reference to FIG. 17, the semiconductor device of the fifth preferred embodiment differs from the device of the first preferred embodiment in that the silicide 70 formed at the connection between the body contact 61 and the SOI layer 3 reaches as deep as the BOX layer 2 under the SOI layer 3. The semiconductor device of the fifth preferred embodiment has otherwise the same structure as that of the device of the first preferred embodiment.

The silicide 70 is formed by the reaction of the barrier metal 61a on the surface of the body contact 61 and the SOI layer 3. Like in the fourth preferred embodiment, when the silicide 70 is formed to reach the depth of the BOX layer 2, uniformity is provided in the depth of the silicide 70. This reduces variations of the resistance at the connection between the body contact 61 and the SOI layer 3, and eventually reduces variations of electrical characteristics of the semiconductor element. Like in the fourth preferred embodiment, the contact area between the silicide 70 and the SOI layer 3 also depends on the depth of the element isolation insulating film 41. The depth of the element isolation insulating film 41 is easier to control than the depth of the silicide 70 and can be controlled precisely. Thus the dependency of the contact area between the silicide 70 and the SOI layer 3 on the depth of the element isolation insulating film 41 does not cause serious problems.

In order for the silicide 70 to reach the BOX layer 2, in the step of filling contact holes with the barrier metal material 6a discussed in the first preferred embodiment with reference to FIG. 8, the barrier metal material 6a should be deposited in an amount sufficient enough to allow silicidation of as deep as the bottom of the SOI layer 3. As an example, if the barrier metal material 6a is Ti and the SOI layer 3 has a thickness of 20 nm, the barrier metal material 6a may be deposited to a thickness of about 5 to 50 nm. Thereafter thermal processing for silicidation is performed at a temperature of about 300 to 800° C. for a duration of about a few seconds to a few minutes, whereby the reaction of the barrier metal 6a and the SOI layer 3 is enhanced to realize silicidation of the SOI layer 3 to the bottom. Thus the resultant silicide 70 reaches as deep as the BOX layer 2.

Figure 18:
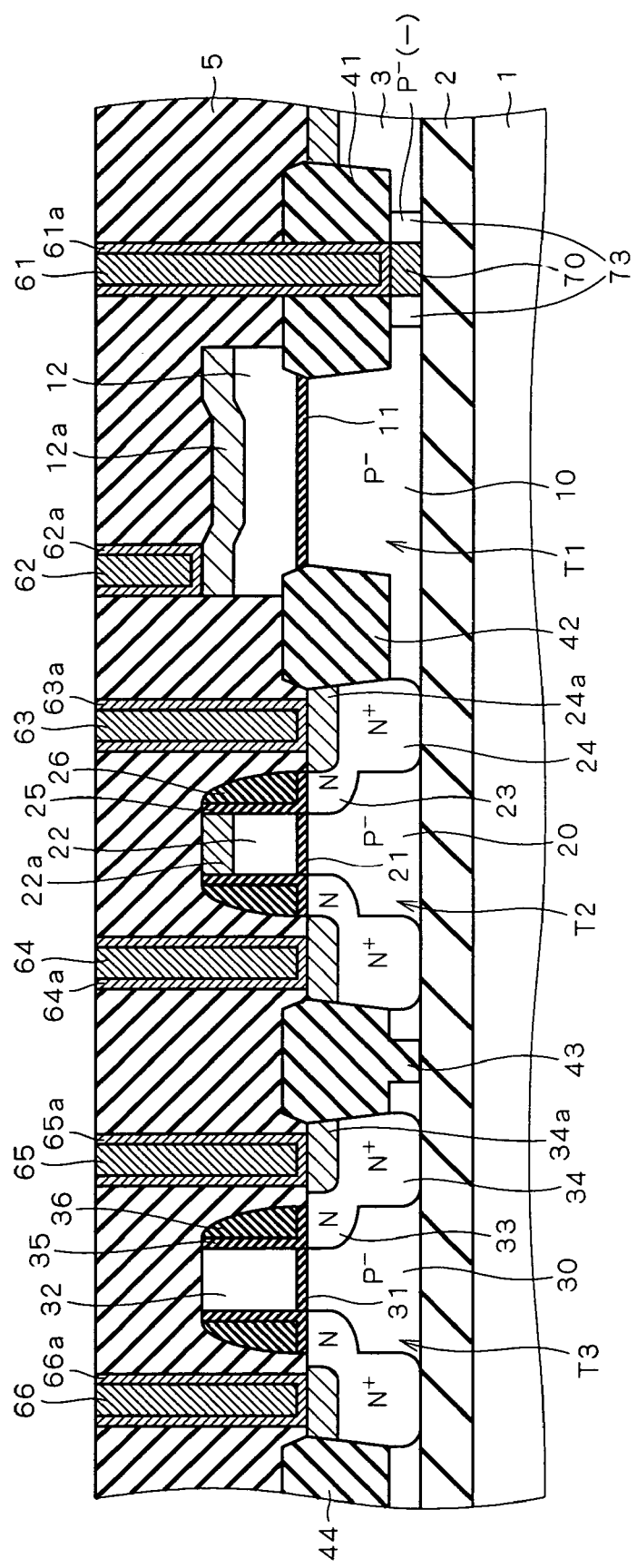
FIGS. 18 and 19 each show a modification of the fifth preferred embodiment.

FIG. 18 shows a modification of the fifth preferred embodiment. The example of FIG. 18 is a combination of the third preferred embodiment with the fifth preferred embodiment, in which the P⁻ (−) region 73 with an impurity concentration locally lower than that of the surrounding region is provided in the vicinity of the connection between the SOI layer 3 and the body contact 61 (namely, in the vicinity of the silicide 70). This further increases the resistance at the connection between the SOI layer 3 and the body contact 61, thereby reducing a leakage current flowing from the body contact 61 into the body regions 10 and 20. The impurity concentration of the P⁻ (−) region 73 is suitably controlled, whereby the resistance at the connection between the body contact 61 and the SOI layer 3 is controlled at a desirable level.

In order to form the P⁻ (−) region 73, after the formation of contact holes, the resist pattern 54 may be formed that has an opening to expose only the contact hole for the body contact 61 as shown in FIG. 13. Using the resist pattern 54 as a mask, N-type impurities are implanted, thereby forming the P⁻ (−) region 73 at the bottom of the contact hole for the body contact 61. The impurities implanted at this stage are diffused by the foregoing thermal processing for the formation of the silicide 70, and thermal processing to follow thereafter. As a result, the P⁻ (−) region 73 eventually extends to surround the silicide 70 as shown in FIG. 18.

Figure 19:
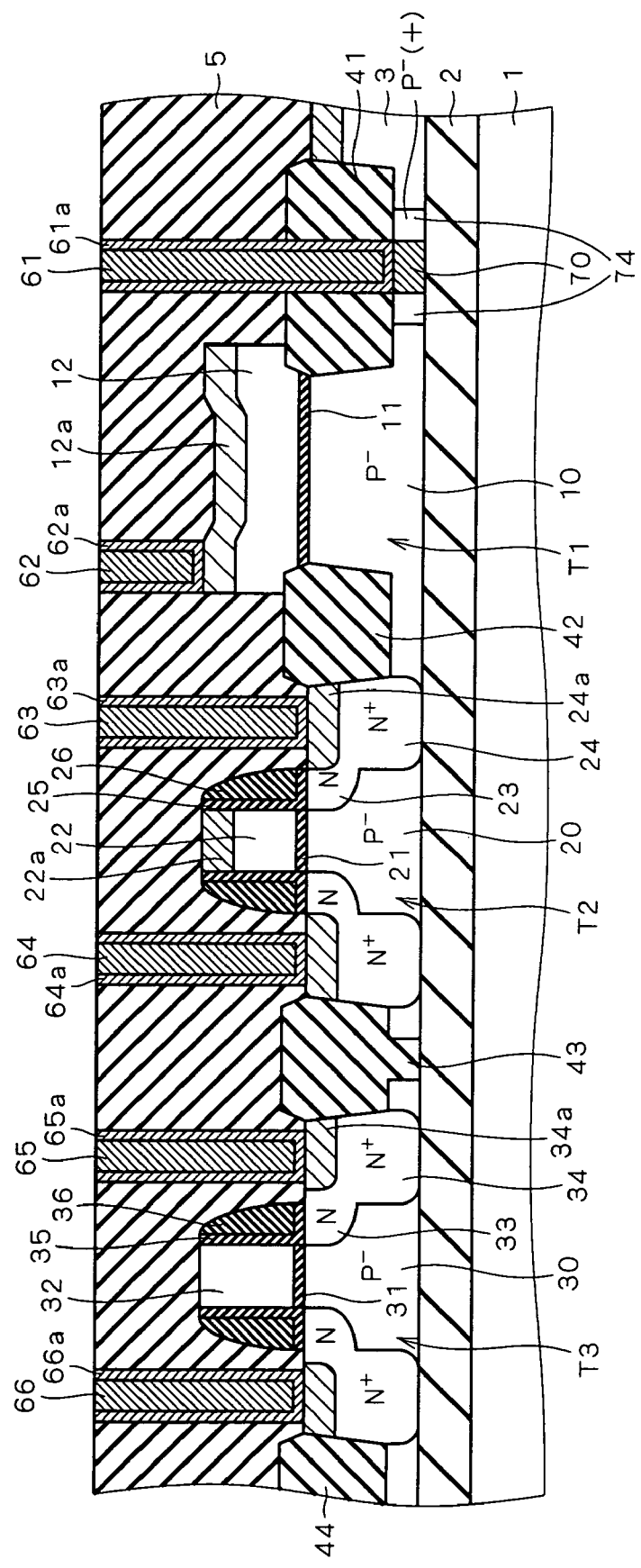

FIG. 19 shows another modification of the fifth preferred embodiment. The structure of FIG. 19 differs from that of FIG. 18 in that the P⁻ (−) region 73 is replaced by the P⁻ (+) region 74 having an impurity concentration locally higher than that of the surrounding region.

In the fifth preferred embodiment, the bottom surface of the silicide 70 reaches as deep as the BOX layer 2, meaning that the silicide 70 and the SOI layer 3 are in contact with each other only at the side surface of the silicide 70. Further, the silicide 70 is formed in the thin portion of the SOI layer 3 under the element isolation insulating film 41. Thus the contact area between the side surface of the silicide 70 and the SOI layer 3 is limited. Accordingly, if the thickness of the SOI layer 3 is considerably small under the element isolation insulating film 41, the resistance at the connection between the body contact 61 and the SOI layer 3 increases to an unnecessarily high level. In this case, the potential of the body regions 10 and 20 is hard to control. In response, the P⁻ (+) region 74 having an impurity concentration locally higher than that of the surrounding region is provided in the vicinity of the silicide 70 as shown in FIG. 19. This reduces the resistance at the connection between the body contact 61 and the SOI layer 3, thereby to overcome the foregoing difficulty in controlling the potential of the body regions 10 and 20. Further, the impurity concentration of the P⁻ (+) region 74 is suitably controlled, whereby the resistance at the connection between the body contact 61 and the SOI layer 3 is controlled at a desirable level.

The P⁻ (+) region 74 can be formed by the same process as used for forming the P⁻ (−) region 73 discussed above with reference to FIG. 18, except that P-type impurities such as B ions or BF2 ions should be implanted.

Sixth Preferred Embodiment

Figure 20:
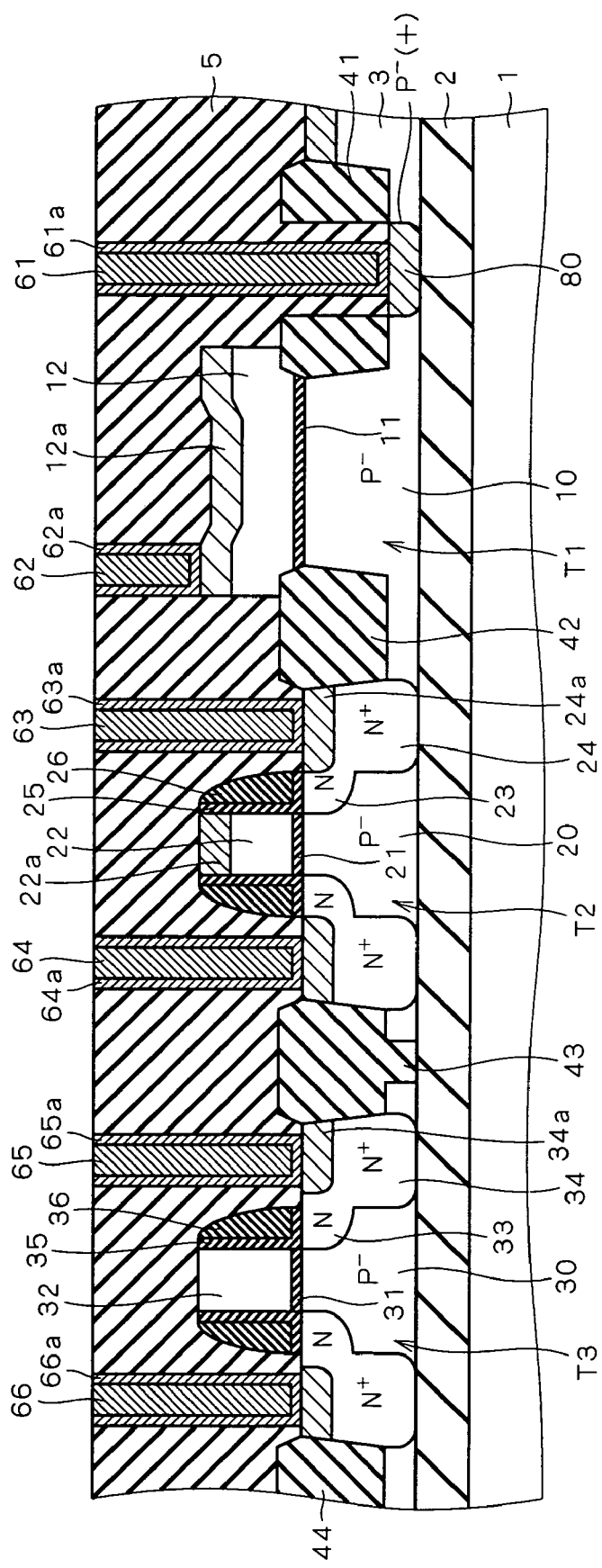
FIG. 20 shows the structure of a semiconductor device according to a sixth preferred embodiment of the present invention.

FIG. 20 shows the structure of a semiconductor device according to a sixth preferred embodiment of the present invention. In FIG. 20, the elements similar to those shown in FIG. 1 are designated by the same reference numerals, and will not be discussed.

Like in the fifth preferred embodiment, a silicide 80 formed at the connection between the body contact 61 and the SOI layer 3 reaches as deep as the BOX layer 2. However, the silicide 80 is not a result of the reaction of the barrier metal 61a and the SOI layer 3. The silicide 80 is formed in the same process as that for forming the silicides 12a, 22a, 24a and 34a.

Like in the fifth preferred embodiment, when the silicide 80 is formed to reach the BOX layer 2, uniformity is provided in the depth of the silicide 80. This reduces variations of the resistance at the connection between the body contact 61 and the SOI layer 3, and eventually reduces variations of electrical characteristics of the semiconductor element. Like in the fourth preferred embodiment, the contact area between the silicide 80 and the SOI layer 3 also depends on the depth of the element isolation insulating film 41. The depth of the element isolation insulating film 41 is easier to control than the depth of the silicide 80 and can be controlled precisely. Thus the dependency of the contact area between the silicide 80 and the SOI layer 3 on the depth of the element isolation insulating film 41 does not cause serious problems.

Next, a method of manufacturing the semiconductor device according to the sixth preferred embodiment will be discussed. Like in the first preferred embodiment, the element isolation insulating films 41 through 44 and the MOS transistors T1, T2 and T3 are formed in the SOI layer 2 (FIG. 2). Then the silicide protection film 51 is formed to cover the gate electrode 32 (FIGS. 3 and 4).

Figure 21:
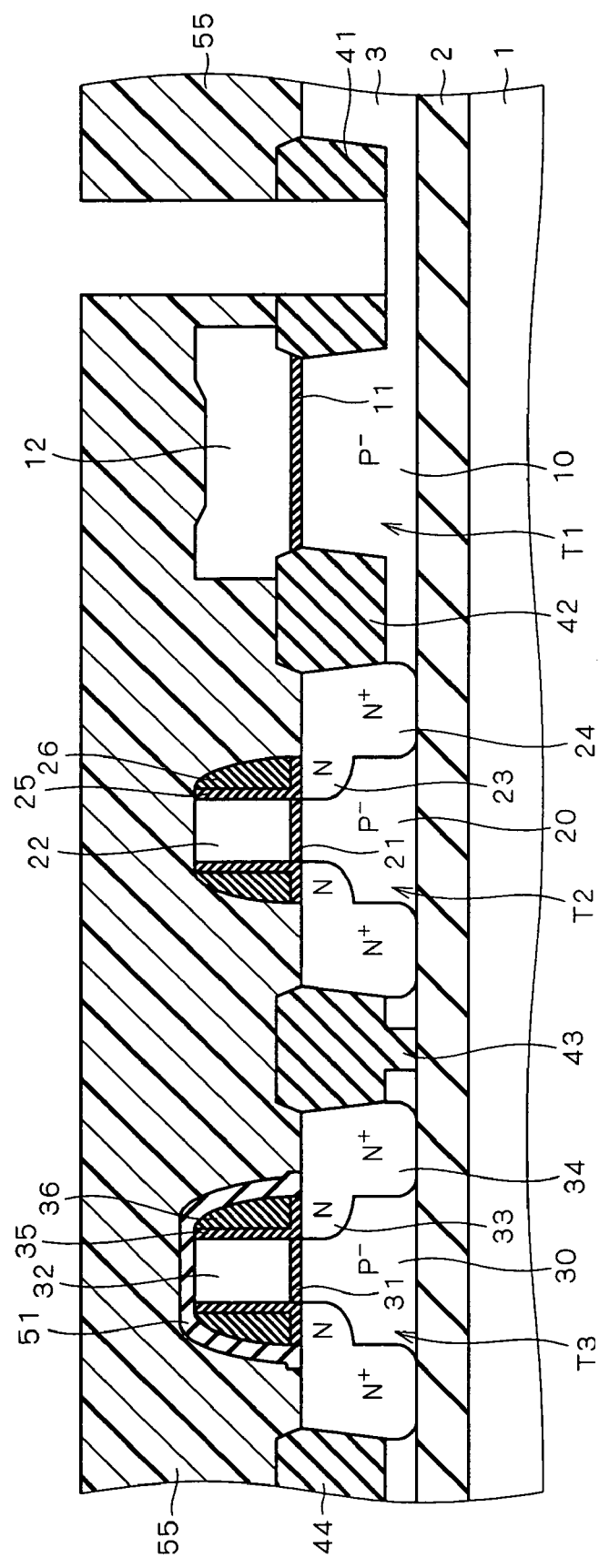
FIGS. 21 and 22 show the process for manufacturing the semiconductor device according to the sixth preferred embodiment.
Figure 22:
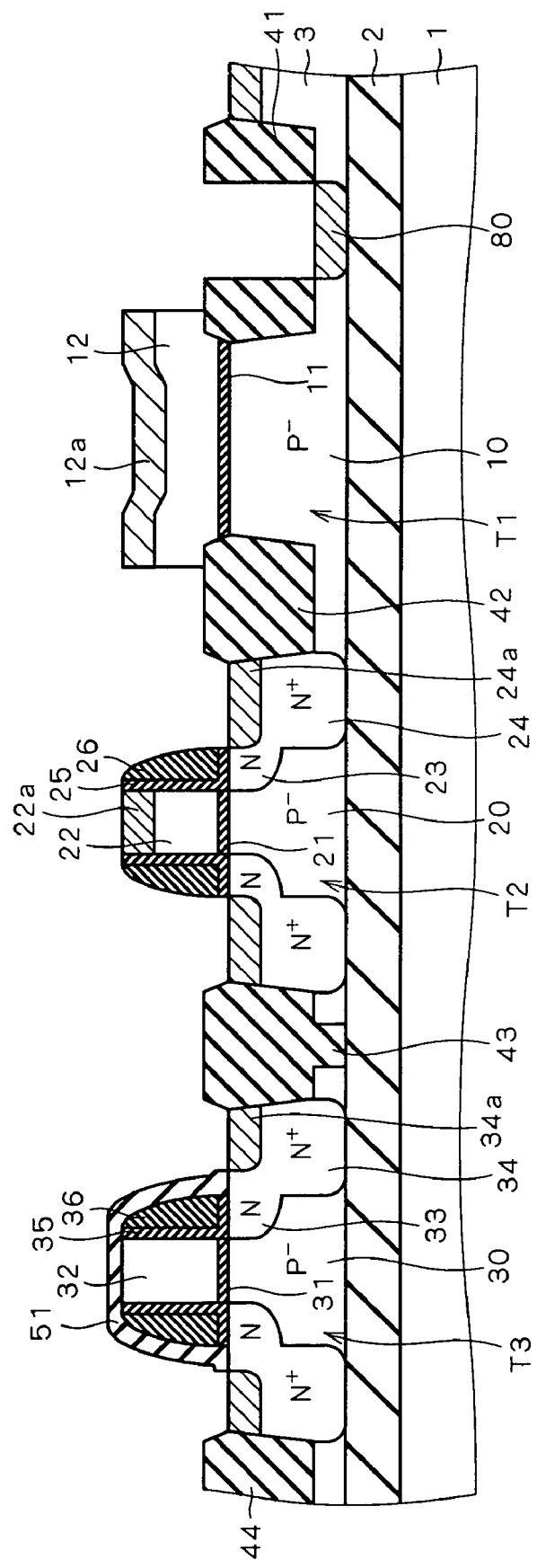

Next, a resist pattern 55 is formed that has an opening to expose a region for forming the body contact 61 as shown in FIG. 21. Using the resist pattern 55 as a mask, the element isolation insulating film 41 is etched for example by processing using HF, whereby an opening is defined in the element isolation insulating film 41 to reach the depth of the SOI layer 3. Thereafter the resist pattern 55 is removed and certain metal for use in silicidation is entirely deposited. At this time, this metal is also accumulated in the opening defined in the element isolation insulating film 41. Thermal processing is subsequently performed to cause reaction of the deposited metal and silicon, whereby the silicides 12a, 22a, 24a and 34a are formed respectively on the gate electrodes 12, 22 and the source/drain regions 24 and 34. At the same time, the silicide 80 is formed at the bottom of the opening defined in the element isolation insulating film 41 (namely, in the SOI layer 3 under the element isolation insulating film 41). The silicides 24a and 34a are formed in the thick portions (regions for forming the MOS transistors T1, T2 and T3) of the SOI layer 3, and hence the silicides 24a and 34a are provided only in the upper parts of the SOI layer 3 without reaching the BOX layer 2. In contrast, the silicide 80 is formed in the thin portion of the SOI layer 3 under the element isolation insulating film 41, and hence the bottom of the silicide 80 reaches as deep as the BOX layer 2 (FIG. 22).

Thereafter the interlayer insulation film 5 is formed and contact holes for forming the contacts 61 through 66 are defined in the interlayer insulation film 5. The contact hole for the body contact 61 is formed to reach the silicide 80 at the bottom of the opening defined in the element isolation insulating film 41. Then a barrier metal material and a metal contact material are deposited to fill each contact hole. Thereafter the excess barrier metal material and metal contact material are removed to form the contacts 61 through 66, whereby the semiconductor device shown in FIG. 20 is obtained.

Figure 23:
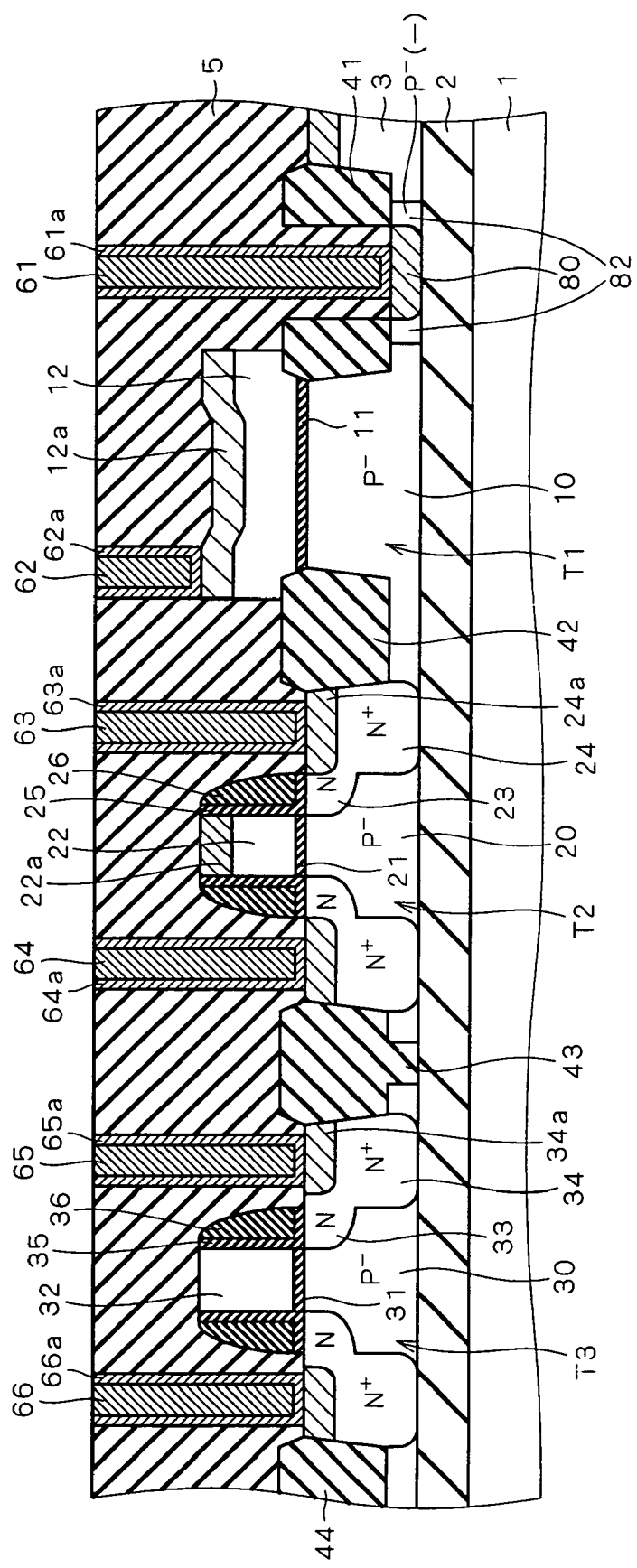
FIG. 23 shows a modification of the sixth preferred embodiment.

FIG. 23 shows a modification of the sixth preferred embodiment. The example of FIG. 23 is a combination of the third preferred embodiment with the sixth preferred embodiment, in which a P$^-$ (−) region 82 with an impurity concentration locally lower than that of the surrounding region is provided in the vicinity of the connection between the SOI layer 3 and the body contact 61 (namely, in the vicinity of the silicide 80). This further increases the resistance at the connection between the SOI layer 3 and the body contact 61, thereby reducing a leakage current flowing from the body contact 61 into the body regions 10 and 20. The impurity concentration of the P$^-$ (−) region 82 is suitably controlled, whereby the resistance at the connection between the body contact 61 and the SOI layer 3 is controlled at a desirable level.

Figure 24:
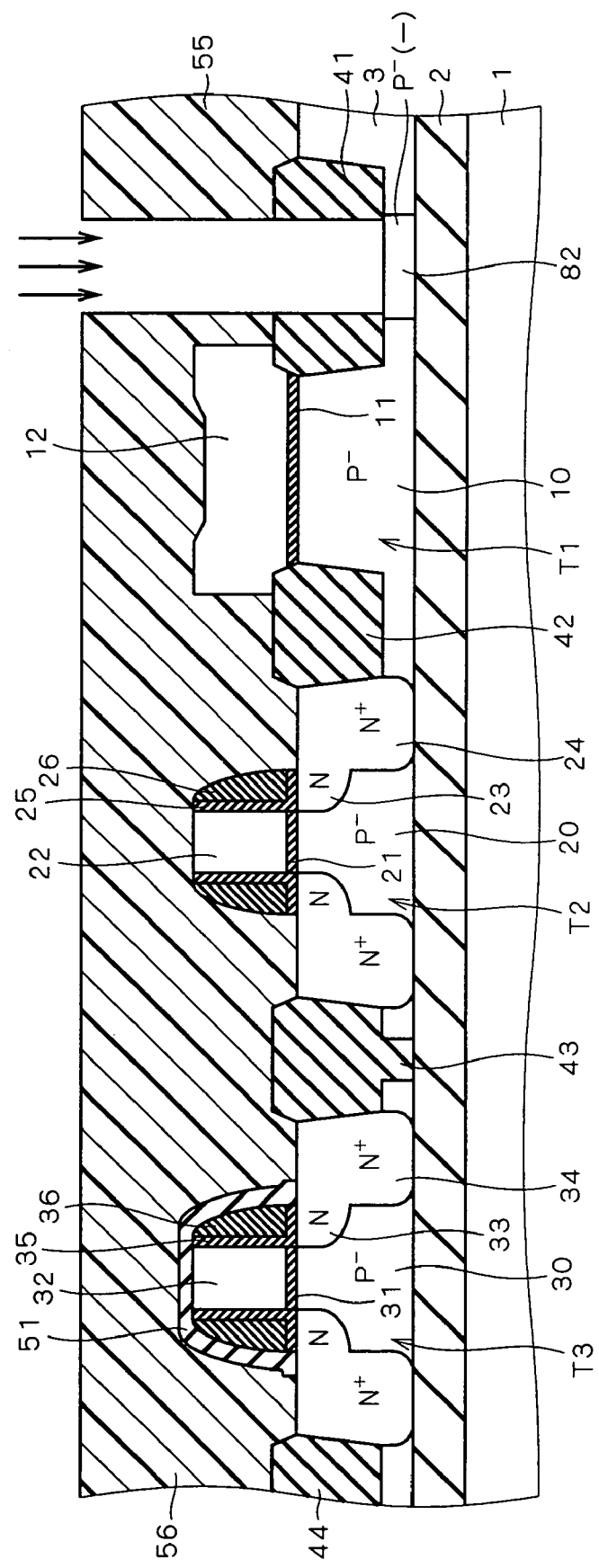
FIG. 24 shows the process for manufacturing the semiconductor device according to the modification of the sixth preferred embodiment.

In order to form the P$^-$ (−) region 82, after the formation of the opening in the element isolation insulating film 41 (shown in FIG. 21), N-type impurities are implanted using the resist pattern 55 as a mask (FIG. 24). Thus the P$^-$ (−) region 82 is formed at the bottom of the opening defined in the element isolation insulating film 41. The impurities implanted at this stage are diffused by the foregoing thermal processing for the formation of the silicide 80, and thermal processing to follow thereafter. As a result, the P$^-$ (−) region 82 eventually extends to surround the silicide 80 as shown in FIG. 23. These N-type impurities may be implanted immediately after the formation of the resist pattern 55 (and before the formation of the opening in the element isolation insulating film 41).

Although not shown, the P$^-$ (−) region 82 shown in FIG. 23 can be replaced by a P$^-$ region (P$^-$ (+) region) having an impurity concentration locally higher than that of the surrounding region. As discussed in the modification of the fifth preferred embodiment with reference to FIG. 19, if the thickness of the SOI layer 3 is considerably small under the element isolation insulating film 41, the resistance at the connection between the body contact 61 and the SOI layer 3 increases to an unnecessarily high level. The P$^-$ (+) region serves to prevent this problem. Further, the impurity concentration of this P$^-$ (+) region is suitably controlled, whereby the resistance at the connection between the body contact 61 and the SOI layer 3 is controlled at a desirable level. In order to form this P$^-$ (+) region, P-type impurities are implanted instead of N-type impurities in the step shown in FIG. 24.

Seventh Preferred Embodiment

Figure 25:
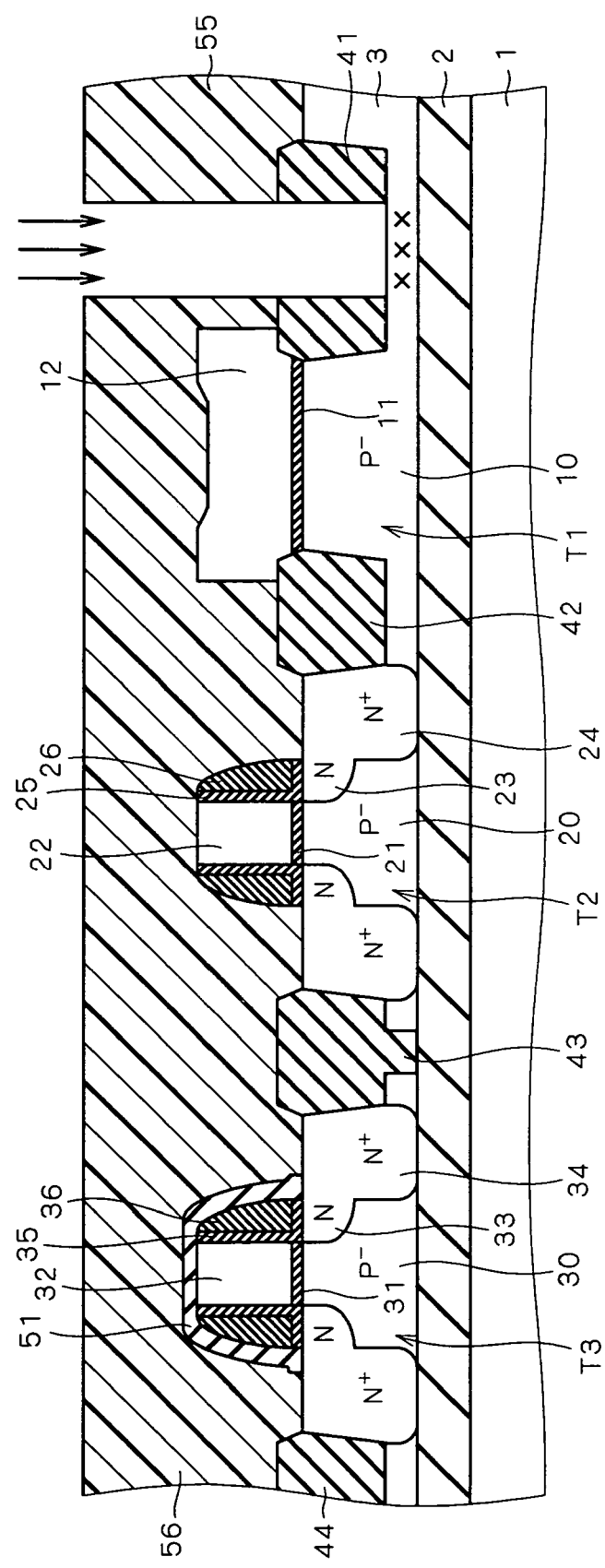
FIGS. 25 and 26 each show the process for manufacturing a semiconductor device according to a seventh preferred embodiment of the present invention.

FIG. 25 shows the process for manufacturing a semiconductor device according to a seventh preferred embodiment of the present invention. The semiconductor device of the seventh preferred embodiment is the same in structure as the semiconductor device of the sixth preferred embodiment (FIG. 20), and thus is not shown in figures.

The process of manufacturing the semiconductor device of the sixth preferred embodiment is applied to the seventh preferred embodiment. Subsequent to the step of defining an opening in the element isolation insulating film 41 (FIG. 21), inactive ions such as Ne ions or Ar ions, or Si ions, C ions, N ions, O ions or F ions are implanted using the resist pattern 55 as a mask at a dose of about $10^{15}$ cm$^{-2}$. As a result, the SOI layer 3 is damaged at the region for forming the silicide 80, thereby generating crystal defects thereat (FIG. 25).

Silicon containing crystal defects is easy to silicide. Thus in the subsequent step of forming the silicides 12a, 22a, 24a, 34a and 80, the bottom of the silicide 80 can reliably reach as deep as the BOX layer 2.

Figure 26:
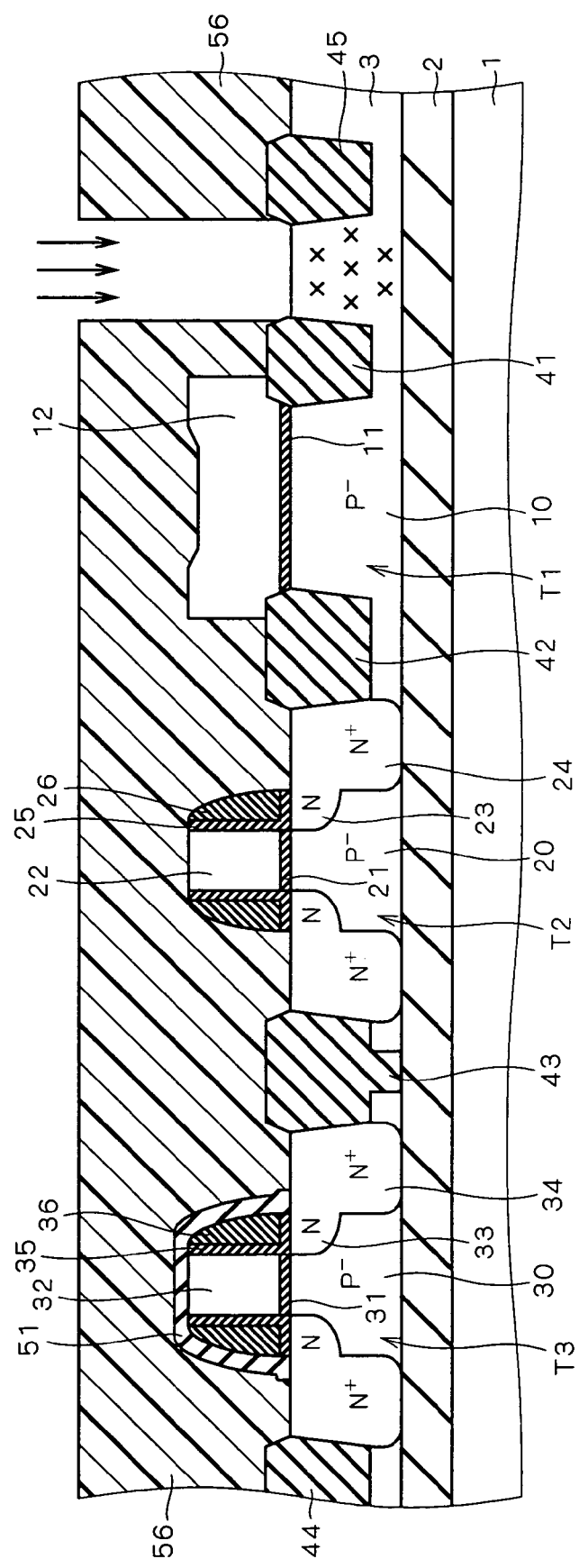

The seventh preferred embodiment is applicable for example to the second preferred embodiment (FIG. 9). Prior to the formation of the silicide 71 at the connection between the body contact 67 and the SOI layer 3, a resist pattern 56 is formed that has an opening to expose a region for forming the silicide 71 (the thick portion of the SOI layer 3 between the element isolation insulating films 41 and 45) as shown in FIG. 26. Using the resist pattern 56 as a mask, Si ions, C ions, N ions, O ions or F ions, or inactive ions such as Ne ions or Ar ions are implanted at a dose of about $10^{15}$ cm$^{-2}$. As a result, the SOI layer 3 is damaged at the region for forming the silicide 71, thereby generating crystal defects thereat.

Figure 27:
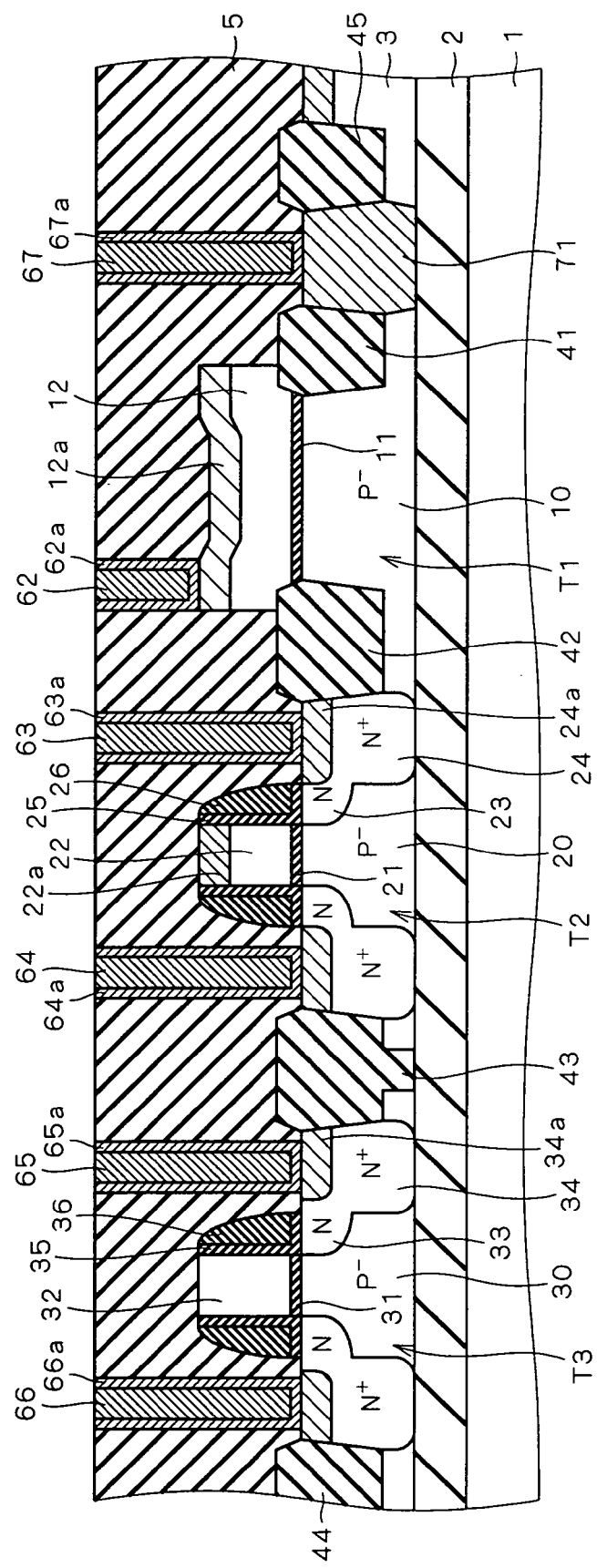
FIG. 27 shows the structure of a semiconductor device according to the seventh preferred embodiment.

Silicon containing crystal defects is easy to silicide. While the silicides 12a, 22a, 24a, 34a and 71 are concurrently formed, only the silicide 71 reaches a great depth. Thus the bottom of the silicide 71 can reach as deep as the BOX layer 2 as shown in FIG. 27, thereby providing uniformity in the depth of the silicide 71. This reduces variations of the resistance at the connection between the body contact 67 and the SOI layer 3, and eventually reduces variations of electrical characteristics of the semiconductor element.

In the seventh preferred embodiment, a mask for use in ion implantation for damaging the SOI layer 3 (the foregoing resist pattern 56) may have various patterns. In this case, damage can be selectively caused only to a portion of the SOI layer 3 to which a particular one of a plurality of body contacts is connected. Thus only a silicide connected to this particular body contact is allowed to reach a great depth. As a result, body contacts having different resistances at the respective connections with the SOI layer 3 can be concurrently provided, thereby contributing to the simplification of the manufacturing process of the semiconductor device.

Eighth Preferred Embodiment

Figure 28:
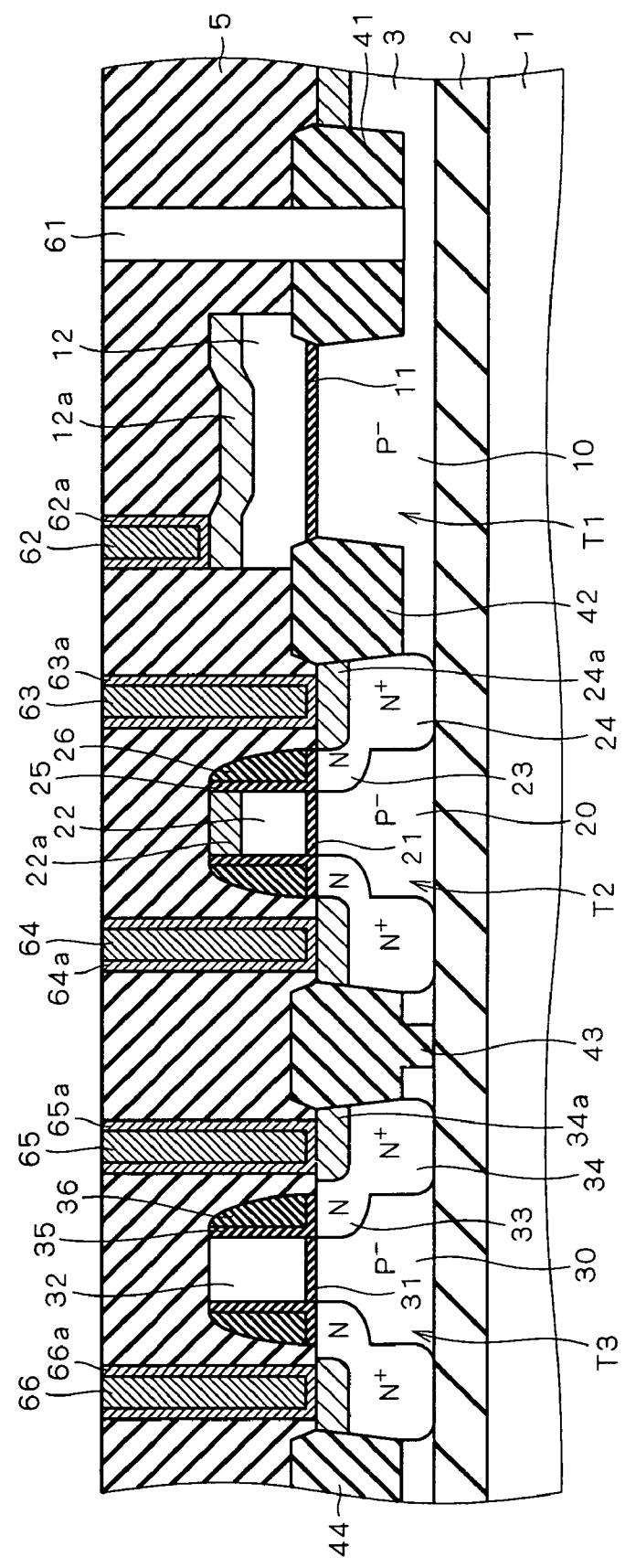
FIG. 28 shows the structure of a semiconductor device according to an eighth preferred embodiment of the present invention.

FIG. 28 shows the structure of a semiconductor device according to an eighth preferred embodiment of the present invention. In FIG. 28, the elements similar to those shown in FIG. 1 are designated by the same reference numerals, and will not be discussed.

The semiconductor device of the eighth preferred embodiment differs from the device of the first preferred embodiment in that the body contact 61 is formed by polysilicon containing impurities (in an amount of about $10^{22}$ cm$^{-3}$, for example) whereas the other contacts 62 through 66 are formed by metal. The semiconductor device of the eighth preferred embodiment has otherwise the same structure as that of the first preferred embodiment.

The contact formed by polysilicon has a higher resistance than the contact formed by metal such as tungsten. A leakage current flowing from the body contact 61 into the body regions 10 and 20 is reduced accordingly, thereby reducing the power consumption of the semiconductor device. The impurity concentration of the polysilicon forming the body contact 61 is suitably controlled, whereby the resistance of the body contact 61 is controlled at a desirable value. The body contact 61 and the SOI layer 3 are both formed by silicon, and hence can be connected with stability. This reduces variations of the resistance at the connection between the body contact 61 and the SOI layer 3.

The contacts 62 through 66 are formed by metal. Thus there will be no increase in the resistance at the connection between each of the contacts 62 through 66 and the SOI layer 3, causing no deterioration in operating speed characteristic of the semiconductor device.

Figure 29:
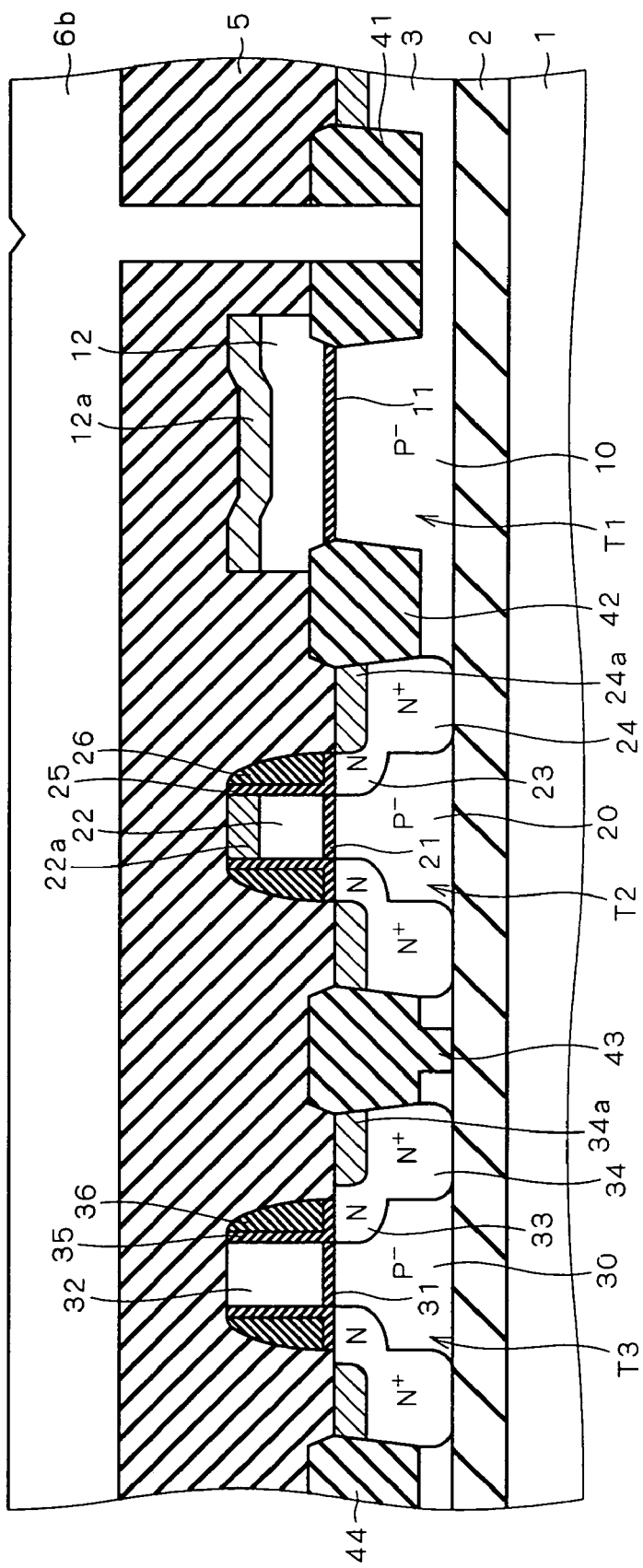
FIG. 29 shows the process for manufacturing the semiconductor device according to the eighth preferred embodiment.

In order to apply polysilicon only for the body contact 61, the body contact 61 and the other contacts 62 through 66 may be formed in different steps. As an example, prior to the formation of the contacts 62 through 66, only a contact hole for the body contact 61 may be defined in the interlayer insulation film 5 as shown in FIG. 29. Next, a polysilicon film 6b is deposited to fill the contact hole for the body contact 61 and then the excess polysilicon film 6b is removed to form the body contact 61. Thereafter the contacts 62 through 66 are formed in another step, whereby the semiconductor device shown in FIG. 28 is obtained in which only the body contact 61 is formed by polysilicon.

Figure 30:
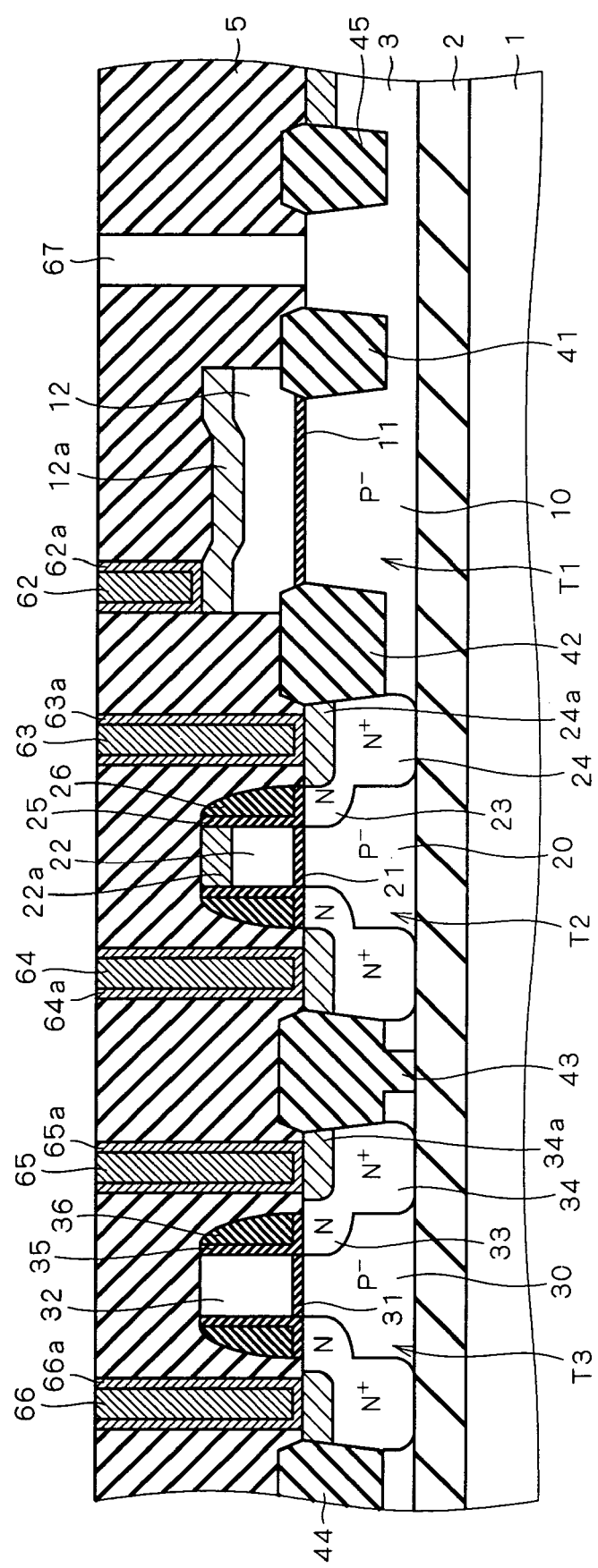
FIG. 30 shows a modification of the eighth preferred embodiment.

Like in the first preferred embodiment, the body contact 61 penetrates the element isolation insulating film 41 to reach the thin portion of the SOI layer 3 thereunder as shown in FIG. 28. Like in the second preferred embodiment, the body contact 61 may alternatively be connected to the thick portion of the SOI layer 3 between the element isolation insulating films 41 and 45. With reference to FIG. 30, the body contact 67 is formed by polysilicon, and thus silicide is not required at the connection between the body contact 67 and the SOI layer 3. That is, the structure of FIG. 30 is similar to the structure shown in FIG. 10 according to the modification of the second preferred embodiment. Like in the manufacturing process shown in FIG. 11, in the process of manufacturing the semiconductor device shown in FIG. 30, the silicide protection film 51 is also provided on the upper surface of the SOI layer 3 between the element isolation insulating films 41 and 45 to avoid silicidation thereof.

Ninth Preferred Embodiment

Figure 31:
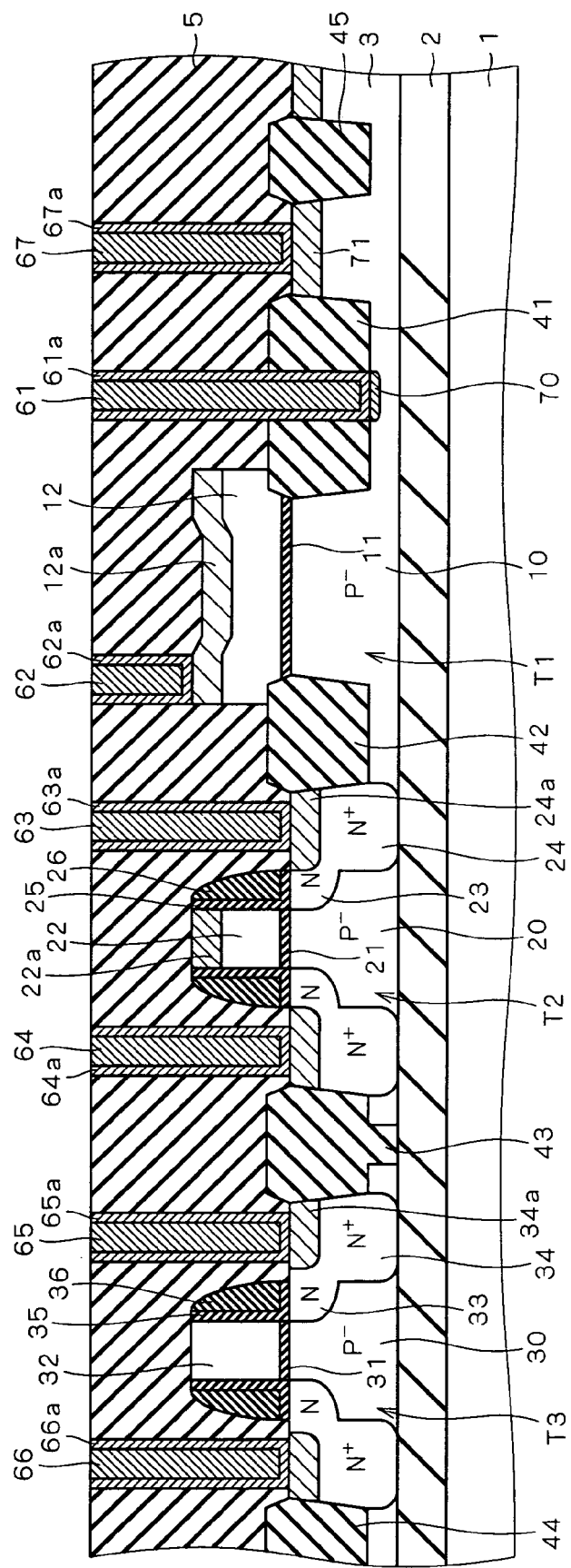
FIG. 31 shows the structure of a semiconductor device according to a ninth preferred embodiment of the present invention.

In the first through eighth preferred embodiments described above, either the body contact 61 penetrating the element isolation insulating film 41 to connect to the SOI layer 3 thereunder or the body contact 67 connecting to the SOI layer 3 defined between the element isolation insulating films 41 and 45 is formed. However, both the body contacts 61 and 67 may be provided as shown in FIG. 31. Further, two or more of the body contacts discussed in the first through eighth preferred embodiments may be provided in one semiconductor device. FIG. 31 shows an example of such a semiconductor device in which both the body contact 61 of the first preferred embodiment and the body contact 67 of the second preferred embodiment are provided.

Tenth Preferred Embodiment

A DTMOS (dynamic threshold voltage metal oxide semiconductor) transistor is known as a semiconductor element employing a body contact. In the DTMOS transistor, the gate electrode of an MOS transistor is connected through a body contact to a body region. In the first through ninth preferred embodiments described above, by establishing electrical connection between the contact 62 connecting to the gate electrode 12 of the MOS transistor T1 and the body contact 61 or 67, the present invention can be applied to a DTMOS.

Figure 32:
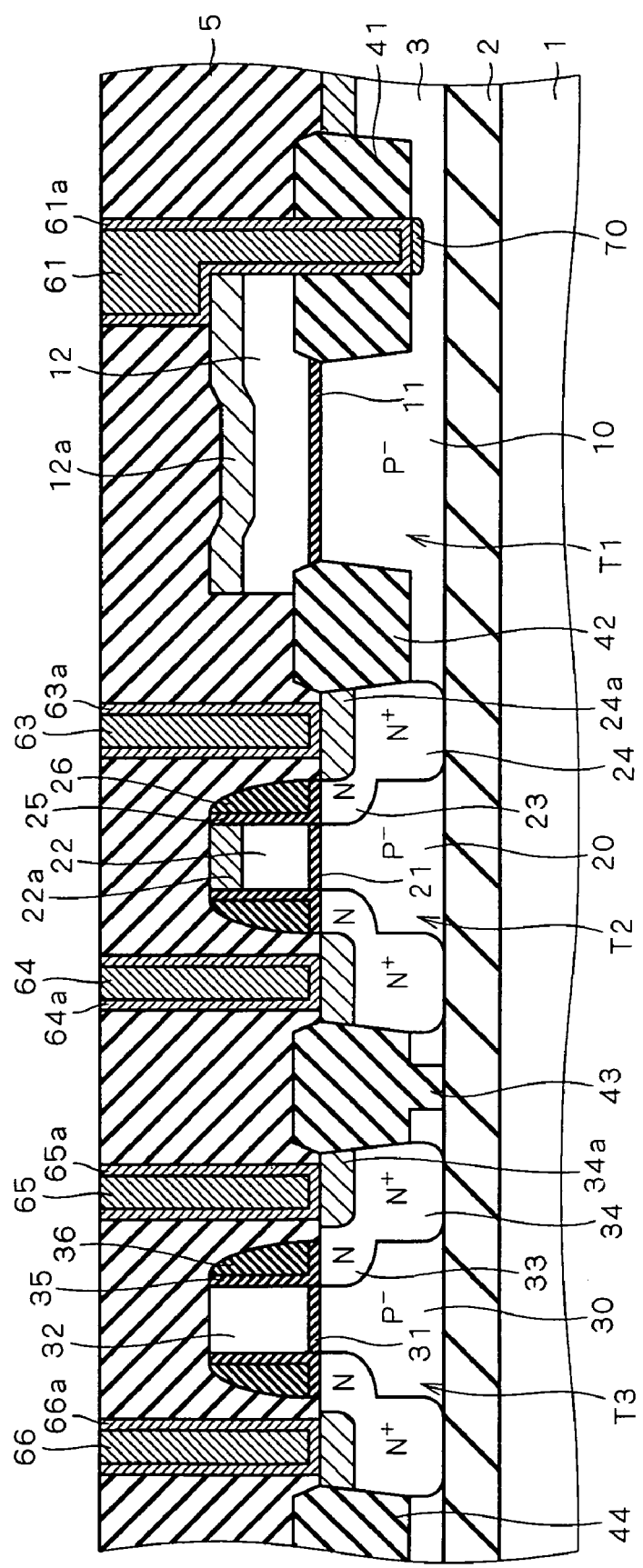
FIG. 32 shows the structure of a semiconductor device according to a tenth preferred embodiment of the present invention.

FIG. 32 shows the structure of a semiconductor device according to a tenth preferred embodiment of the present invention. When the present invention is applied to a DTMOS, the contact 62 connecting to the gate electrode 12 and the body contact 61 connecting to the SOI layer 3 under the element isolation insulating film 41 may be integrally formed. More specifically, the body contact 61 may also be connected to the gate electrode 12 as shown in FIG. 32, whereby the body contact 61 also acts as the contact 62. This reduces the number of contacts required, thereby contributing to a higher degree of integration of a semiconductor device.

Eleventh Preferred Embodiment

In an eleventh preferred embodiment of the present invention, the present invention is applied to an SRAM (static random access memory).

Figure 33:
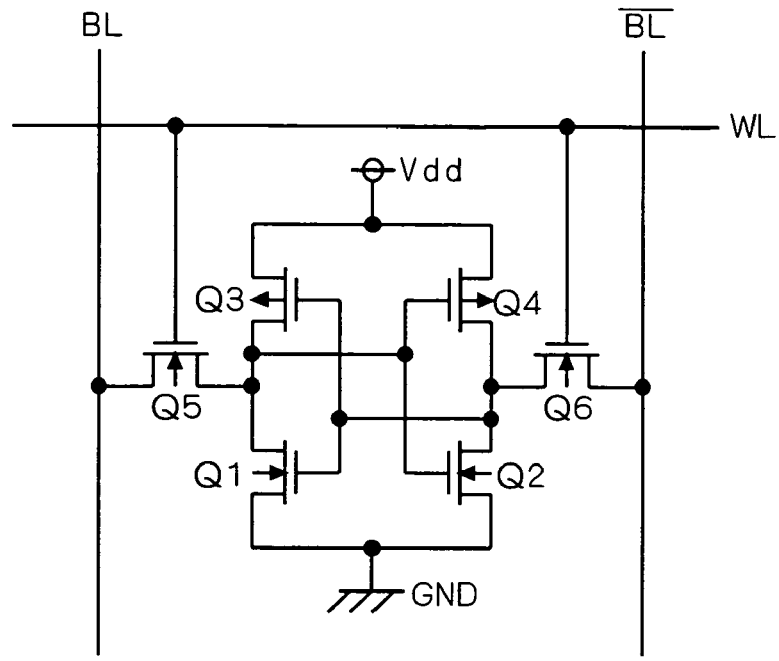
FIG. 33 is a circuit diagram of a commonly used SRAM cell.

FIG. 33 is a circuit diagram of a commonly used SRAM cell. With reference to FIG. 33, this SRAM cell includes six transistors Q1 through Q6. The SRAM cell shown in FIG. 33 has a pair of inverters, one including the NMOS driver transistor Q1 and the PMOS load transistor Q3, and the other including the NMOS driver transistor Q2 and the PMOS load transistor Q4. These inverters are connected to each other to form a flip-flop circuit. This flip-flop circuit and the NMOS access transistors Q5 and Q6 for data transfer together form one SRAM cell. A word line WL is connected to the gates of the access transistors Q5 and Q6. Bit lines BL and $\overline{\text{BL}}$ are respectively connected to the access transistors Q5 and Q6 at their source/drain.

Figure 34:
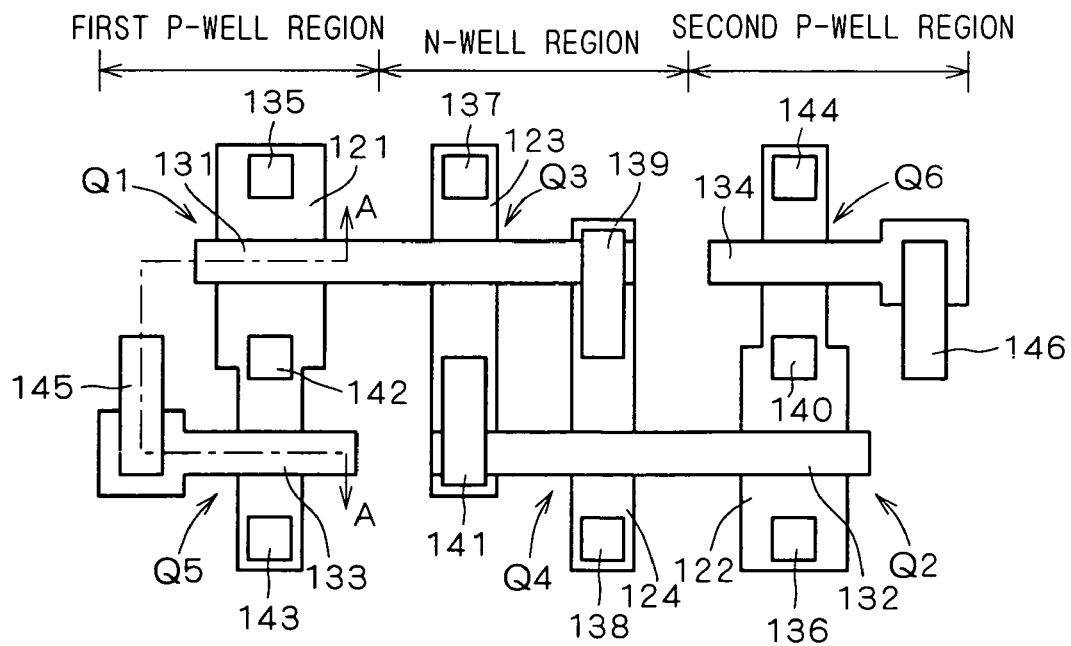
FIG. 34 is a top plan view of an SRAM cell according to an eleventh preferred embodiment of the present invention.

FIG. 34 is a top plan view of an SRAM cell according to the eleventh preferred embodiment. The SRAM cell shown in FIG. 34 is defined in a first P-well region, an N-well region and a second P-well region formed in an SOI layer. Active regions 121 through 124 are defined by an element isolation insulating film 114 in the first, second N-well regions and the P-well region. The driver transistor Q1 and the access transistor Q5 are formed in the active region 121 in the first P-well region. The driver transistor Q2 and the access transistor Q6 are formed in the active region 122 in the second P-well region. The load transistors Q3 and Q4 are formed respectively in the active regions 123 and 124 in the N-well region.

Gate electrodes 131 through 134 are formed on the active regions 121 through 124. The gate electrode 131 acts as the gates of the driver transistor Q1 and the load transistor Q3. The gate electrode 132 acts as the gates of the driver transistor Q2 and the load transistor Q4. The gate electrodes 133 and 134 act as respective gates of the access transistors Q5 and Q6. The layout shown in FIG. 34 simplifies the shape of each of the active regions 121 through 124 and the gate electrodes 131 through 134, and thus is suitably applicable for reduction of the forming area of the SRAM cell.

The source regions of the driver transistors Q1 and Q2 are connected to a ground (GND) wiring through contacts 135 and 136, respectively. The source regions of the load transistors Q3 and Q4 are connected to a power source (Vdd) wiring through contacts 137 and 138, respectively.

A contact 139 on the gate electrode 131 also reaches the drain region of the load transistor Q4. The contact 139 is connected through an upper wiring (not shown) to a contact 140 on the drain region of the driver transistor Q2. Likewise, a contact 141 on the gate electrode 132 also reaches the drain region of the load transistor Q3. The contact 141 is connected through an upper wiring (not shown) to a contact 142 on the drain region of the driver transistor Q1.

One of the source and drain regions of the access transistor Q5 is connected to the drain region of the driver transistor Q1, whereas the other one of the source and drain regions of the access transistor Q5 is connected through a contact 143 to the bit line. Likewise, one of the source and drain regions of the access transistor Q6 is connected to the drain region of the driver transistor Q2, whereas the other one of the source and drain regions of the access transistor Q6 is connected through a contact 144 to the bit line.

The gate electrodes 133 and 134 are connected respectively through contacts 145 and 146 to the word line. The circuit configuration of the SRAM cell shown in FIG. 33 is thereby obtained.

Figure 35:
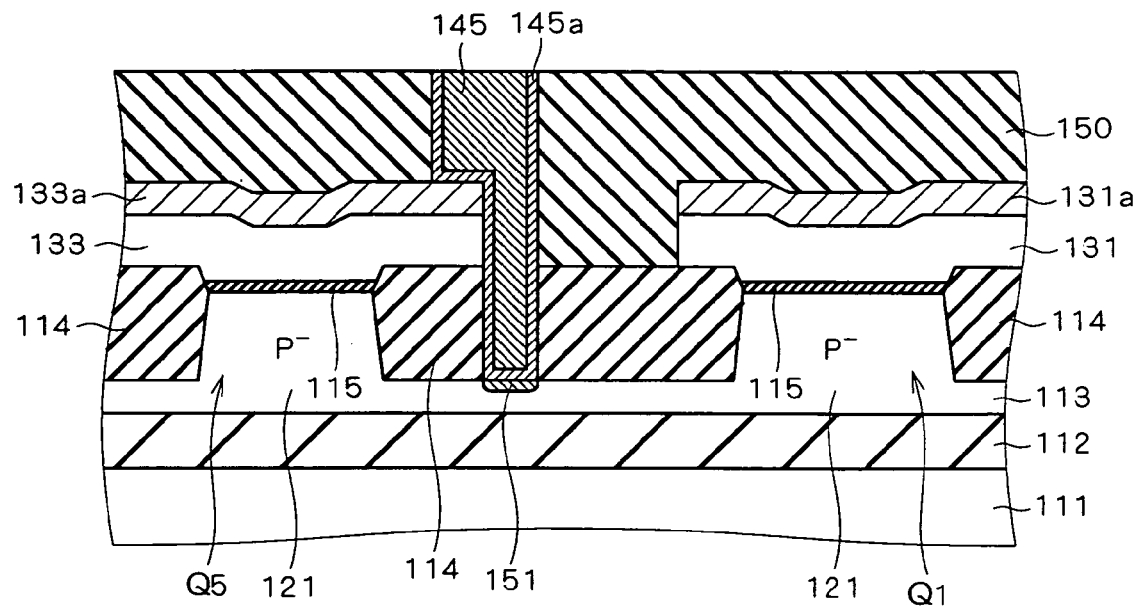
FIG. 35 is a sectional view of the SRAM cell according to the eleventh preferred embodiment.

In the eleventh preferred embodiment, the present invention is applied to the driver transistors Q1, Q2 and to the access transistors Q5 and Q6. FIG. 35 is a sectional view of the SRAM cell according to the eleventh preferred embodiment, taken along a line A-A in FIG. 34. Although not discussed in the following for the same of simplicity, the driver transistor Q2 and the access transistor Q6 respectively have the same structures as those of the driver transistor Q1 and the access transistor Q5.

With reference to FIG. 35, the SRAM cell of the eleventh preferred embodiment is arranged on an SOI substrate including a silicon substrate 111, a BOX layer 112 and an SOI layer 113. The active region 121 is defined by the element isolation insulating film 114 formed in the upper surface of the SOI layer 113. A gate oxide film 115 is formed in the upper surface of the active region 121. The gate electrodes 131 and 133 are provided on the gate oxide film 115. Silicides 131a and 133a are provided respectively in the upper parts of the gate electrodes 131 and 133 containing polysilicon.

An interlayer insulation film 150 is formed to cover the driver transistor Q1 and the access transistor Q5. The contact 145 formed in the interlayer insulation film 150 has a surface provided with a barrier metal 145a, and is connected to the word line of an upper layer (not shown). The contact 145 is connected to the gate electrode 133, while penetrating the element isolation insulating film 114 to connect to the SOI layer 113 thereunder. Namely, the contact 145 is the same in structure as the body contact 61 of the tenth preferred embodiment (FIG. 32). A silicide 151 is formed by the reaction of the SOI layer 113 and the barrier metal 145a at the connection between the SOI layer 113 and the contact 145.

In the active region 121, a P⁻ region under the gate electrode 131 acts as the body region of the driver transistor Q1, whereas a P⁻ region under the gate electrode 133 acts as the body region of the access transistor Q5. The element isolation insulating film 114 does not reach the BOX layer 112, thereby providing partial isolation as shown in FIG. 35. As a result, the body region of the driver transistor Q1 and the body region of the access transistor Q5 are electrically connected through the SOI layer 113 under the element isolation insulating film 114.

Thus the contact 145 is electrically connected to both the body regions of the access transistor Q5 and the driver transistor Q1 as well as to the gate electrode 133, by which the access transistor Q5 acts as a DTMOS in which its gate electrode and its body region are electrically connected.

With the configuration discussed so far, when the SRAM cell is in operation, the potentials of the body regions of the driver transistor Q1 and the access transistor Q5 (body potentials) increase together with increase of the potential of the word line. This reduces the threshold voltages of the driver transistor Q1 and the access transistor Q5 to enhance current drive capability, whereby the operating speed capability of the SRAM cell is improved. When the SRAM cell is in standby, the potential of the word line is at 0 V, fixing the body potentials of the driver transistor Q1 and the access transistor Q5 at 0V. This provides a higher degree of soft error immunity of the SRAM cell to thereby realize a high degree of reliability of the SRAM cell.

However, in an SRAM cell including a DTMOS as an access transistor, the potential increase of a word line turns the access transistor to ON state, thereby forward-biasing the PN junction between the body region and the source/drain region to cause a flow of a leakage current from a body contact into the PN junction. Thus an SRAM employing a conventional DTMOS causes considerable increase of power consumption.

Figure 36:
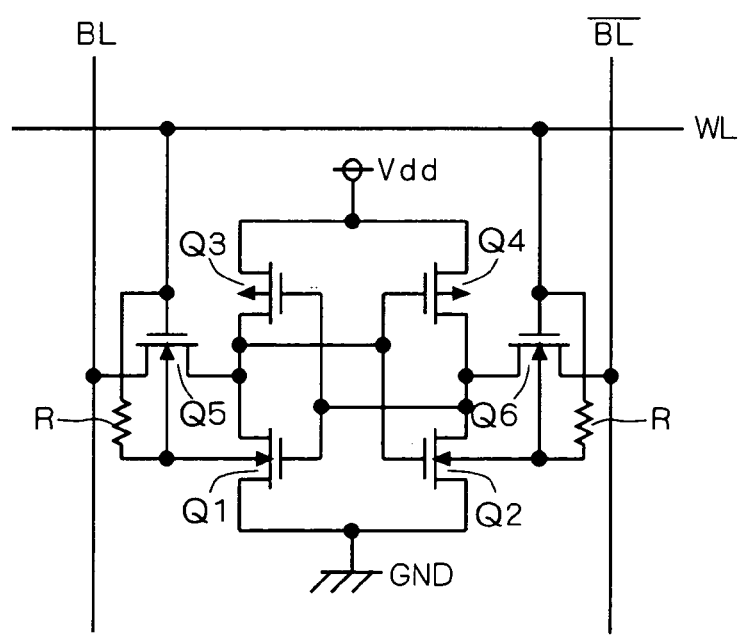
FIG. 36 is an equivalent circuit diagram of the SRAM cell according to the eleventh preferred embodiment.

In the eleventh preferred embodiment, the first preferred embodiment discussed above is applied to the body contact 145. More specifically, a Schottky junction is formed between the contact 145 and the SOI layer 113 to increase the resistance between the word line and the body regions of the driver transistor Q1 and the access transistor Q5. This means a resistor is interposed between the word line and the body regions of the driver transistor Q1 and the access transistor Q5 in an equivalent circuit as shown in FIG. 36. Thus when the access transistor Q5 is in ON state, a certain voltage is maintained by the resistance at the connection between the word line and the body regions of the driver transistor Q1 and the access transistor Q5 (as represented by a resistor R in FIG. 36). This correspondingly controls a voltage to be applied to each PN junction between the body region and the source/drain of the driver transistor Q1 and the access transistor Q5. As a result, a leakage current flowing from the body contact 145 into these PN junctions is reduced to thereby prevent increase of power consumption.

The contact 145 and the SOI layer 113 are connected through the silicide 151, meaning that stability is provided in the connection therebetween to reduce variations of the resistance at this connection. As a result, variations of electrical characteristics between SRAM cells can be reduced.

In the foregoing description of the eleventh preferred embodiment, the first preferred embodiment is applied to the body contact 145 of the SRAM. Alternatively, the second through tenths preferred embodiments may also be applied to the body contact 145, in which case the resistance between the word line and the body regions of the driver transistor Q1 and the access transistor Q5 can also be increased to reduce a leakage current. In this case, a silicide may also be formed at the connection between the contact 145 and the SOI layer 113, whereby variations of the resistance at the connection between the contact 145 and the SOI layer 113 are reduced, and eventually variations of electrical characteristics between SRAM cells can be reduced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
 a semiconductor layer provided on an insulation layer;
 a semiconductor element formed in said semiconductor layer; and
 a body contact connected to said semiconductor layer to be connected to a body region of said semiconductor element, the connection between said body contact and said semiconductor layer being made by a Schottky junction,
 wherein a silicide is formed at a connection between said body contact and said semiconductor layer, and
 said Schottky junction is formed between said silicide and said semiconductor layer.

2. The semiconductor device according to claim 1,
 wherein said semiconductor layer is provided with a region in a vicinity of the connection with said body contact, having an impurity concentration locally different from that of a surrounding region.

3. The semiconductor device according to claim 1,
 wherein a region for forming said semiconductor element is defined by an isolation insulating film formed in an upper part of said semiconductor layer, and
 wherein said body contact penetrates said isolation insulating film to reach a depth of said semiconductor layer under said isolation insulating film, thereby forming the connection between said body contact and said semiconductor layer.

4. The semiconductor device according to claim 3,
 wherein said body contact penetrates said semiconductor layer under said isolation insulating film to reach a depth of said insulation layer.

5. The semiconductor device according to claim 1,
 wherein said body contact has a surface provided with a barrier metal, and
 wherein said silicide is formed by a reaction of said barrier metal and said semiconductor layer.

6. The semiconductor device according to claim 1,
 wherein said silicide reaches a depth of said insulation layer.

7. A semiconductor device, comprising:
 a semiconductor layer provided on an insulation layer;
 a semiconductor element formed in said semiconductor layer; and
 a body contact connected to said semiconductor layer to be connected to a body region of said semiconductor element,
 wherein a silicide is formed at a connection between said body contact and said semiconductor layer, said silicide reaching a depth of said insulation layer.

8. The semiconductor device according to claim 7,
 said body contact has a surface provided with a barrier metal, and
 wherein said silicide is formed by a reaction of said barrier metal and said semiconductor layer.

9. The semiconductor device according to claim 7,
 wherein said semiconductor layer is provided with a region in the vicinity of said silicide, having an impurity concentration locally different from that of a surrounding region.

10. The semiconductor device according to claim 7,
 wherein a region for forming said semiconductor element is defined by an isolation insulating film formed in an upper part of said semiconductor layer, and
 wherein said body contact penetrates said isolation insulating film to reach a depth of said semiconductor layer under said isolation insulating film, thereby forming the connection between said body contact and said semiconductor layer.

* * * * *